(12) United States Patent
Choi et al.

(10) Patent No.: US 9,941,174 B2
(45) Date of Patent: Apr. 10, 2018

(54) SEMICONDUCTOR DEVICES HAVING FIN ACTIVE REGIONS

(71) Applicant: Samsung Electronics Co., Ltd, Suwon-Si, Gyeonggi-do (KR)

(72) Inventors: Kyungin Choi, Seoul (KR); Ah-Young Cheon, Suwon-si (KR); Kwang-Yong Yang, Seoul (KR); Myungil Kang, Yongin-si (KR); Dohyoung Kim, Hwaseong-si (KR); YoonHae Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/007,711

(22) Filed: Jan. 27, 2016

(65) Prior Publication Data

US 2016/0276344 A1    Sep. 22, 2016

(30) Foreign Application Priority Data

Mar. 20, 2015   (KR) .................. 10-2015-0039057

(51) Int. Cl.
| | |
|---|---|
| *H01L 31/0312* | (2006.01) |
| *H01L 21/8238* | (2006.01) |
| *H01L 29/66* | (2006.01) |
| *H01L 27/092* | (2006.01) |
| *H01L 21/265* | (2006.01) |
| *H01L 29/165* | (2006.01) |

(52) U.S. Cl.
CPC ............... *H01L 21/823814* (2013.01); *H01L 21/823821* (2013.01); *H01L 27/0924* (2013.01); *H01L 29/66545* (2013.01); *H01L 21/26586* (2013.01); *H01L 29/165* (2013.01)

(58) Field of Classification Search
CPC ........... H01L 21/26586; H01L 27/0886; H01L 29/165; H01L 29/66545; H01L 21/823814; H01L 27/0924
USPC .......................................................... 257/77
See application file for complete search history.

(56) References Cited

U.S. PATENT DOCUMENTS

| | | | |
|---|---|---|---|
| 8,313,999 B2 | 11/2012 | Capellani et al. | |
| 8,598,003 B2 | 12/2013 | Murtthy et al. | |
| 8,674,433 B2 | 3/2014 | Liao et al. | |
| 2002/0190284 A1* | 12/2002 | Murthy | ............ H01L 21/28052 257/286 |
| 2005/0173759 A1* | 8/2005 | Kim | ................. H01L 29/66621 257/331 |
| 2014/0008736 A1 | 1/2014 | Li et al. | |
| 2015/0171215 A1* | 6/2015 | Han | ..................... H01L 27/0207 365/208 |
| 2016/0099181 A1* | 4/2016 | Tung | ............... H01L 21/823821 257/369 |

\* cited by examiner

*Primary Examiner* — Thien F Tran
(74) *Attorney, Agent, or Firm* — Ward and Smith, P.A.

(57) ABSTRACT

Semiconductor devices are providing including a first isolation region configured to define a first fin active region protruding from a substrate, first gate patterns on the first fin active region, and a first epitaxial region in the first fin active region between the first gate patterns. Sidewalls of the first epitaxial region have first inflection points so that an upper width of the first epitaxial region is greater than a lower width of the first epitaxial region.

16 Claims, 34 Drawing Sheets

SEMICONDUCTOR DEVICES HAVING FIN ACTIVE REGIONS

CROSS-REFERENCE TO RELATED APPLICATION

This application claims priority under 35 U.S.C. §119 to Korean Patent Application No. 10-2015-0039057, filed Mar. 20, 2015, the disclosure of which is hereby incorporated herein by reference as if set forth in its entirety.

FIELD

Embodiments of the inventive concept relate generally to semiconductor devices and, more particularly, to semiconductor devices having fin active regions and methods of manufacturing the same.

BACKGROUND

Fin active regions and source/drain regions that are epitaxially grown are typically formed by recessing and epitaxial growth processes. Accordingly, due to a wet etching process and an anisotropic etching process for forming recess regions, the recess regions may have uneven sidewalls that can be shaped like, for example, spherical balls. Uneven sidewalls are generally not good for the performance of a metal oxide semiconductor (MOS) transistor.

SUMMARY

Some embodiments of the present inventive concept provide semiconductor devices including a first isolation region configured to define a first fin active region protruding from a substrate, first gate patterns on the first fin active region, and a first epitaxial region in the first fin active region between the first gate patterns. Sidewalls of the first epitaxial region may include first inflection points so that an upper width of the first epitaxial region is greater than a lower width thereof.

In further embodiments, lower portions of the sidewalls of the first epitaxial region below the first inflection points may be vertically flat.

In still further embodiments, a width of the first epitaxial region adjacent to a surface of the first fin active region may be a maximum width therein.

In some embodiments, the first fin active region may include a plurality of fin active regions connected with each other in a bridge shape.

In further embodiments, the semiconductor device may further include an air space between the first fin active region and the isolation region.

In still further embodiments, the semiconductor device may further include a second fin active region protruding from the substrate, second gate patterns on the second fin active region, and a second epitaxial region in the second fin active region between the second gate patterns. The second epitaxial region may be wider and deeper than the first epitaxial region.

In some embodiments, sidewalls of the second epitaxial region may have second inflection points so that an upper width of the second epitaxial region is greater than a lower width thereof.

In further embodiments, the first epitaxial region may include at least one of silicon (Si) and silicon carbide (SiC), and the second epitaxial region may include silicon-germanium (SiGe).

In some embodiments, each of the first gate patterns may include first interface insulating layers on a surface of the first fin active region, first gate electrodes on the first interface insulating layers, first gate barrier layers surrounding outer sidewalls and bottom surfaces of the first gate electrodes in a U-shape, a first gate insulating layers surrounding outer sidewalls and bottom surfaces of the first gate barrier layers in a U-shape, and first spacers on outer sidewalls of the first gate insulating layers.

In further embodiments, the first interface insulating layers may include silicon oxide formed by oxidizing the surface of the first fin active region.

Still further embodiments provide semiconductor device including an isolation region defining a first fin active region and a second fin active region which are protruding from a substrate, first gate patterns on the first fin active region and second gate patterns on the second fin active region, and a first source/drain region in the first fin active region between the first gate patterns and a second source/drain region in the fin active region between the second patterns. The second source/drain region may have sidewalls having inflection points so that an upper width of the second source/drain region is greater than a lower width thereof.

In some embodiments, the semiconductor device may further include first gate spacers on sidewalls of the first gate patterns, and second gate spacers on sidewalls of the second gate patterns. The first gate spacers may be thinner than the second spacers.

In further embodiments, the first source/drain region may have sidewalls vertically flat, and may be substantially vertically aligned with interfaces between the first gate patterns and the first gate spacers.

In still further embodiments, the sidewalls of the second source/drain region may vertically overlap and align with the second gate spacers.

In some embodiments, the first source/drain region may have sidewalls having inflection points so that an upper width of the first source/drain region is greater than a lower width thereof.

In further embodiments, the first source/drain region may be wider and deeper than the second source/drain region.

In still further embodiments, the semiconductor device may further include first active spacers on sidewalls of the first fin active region and second active spacers on sidewalls of the second fin active region. The first fin active spacers may be smaller than the second fin active spacers.

In some embodiments, the first fin active region and the second fin active region each may include a plurality of fin active regions connected with each other in a bridge shape.

In further embodiments, the semiconductor device may include air spaces formed between the first fin active region and the isolation region and between the second fin active region and the isolation region.

In still further embodiments, bottom surfaces of the first source/drain region and the second source/drain region may be in lower levels than an upper surface of the isolation region.

In some embodiments, upper surfaces of the first source/drain region and the second source/region may be in higher levels than bottom surfaces of the first gate patterns and the second gate patterns.

Further embodiments of the present inventive concept provide semiconductor devices including an isolation region defining a first fin active region and a second fin active region, a first recess region in the first fin active region and a second recess region in the second fin active region, and a first epitaxial region filling the first recess region and protruding from the first active region and a second epitaxial region filling the second recess region and protruding from the second fin active region.

In still further embodiments, the second recessed region may have inflection points. An upper width of the second recessed region adjacent to a surface of the second fin active region may be greater than a lower width of the second recessed region.

In some embodiments, the first epitaxial region may be wider and deeper than the second epitaxial region.

In further embodiments, the first epitaxial region may include silicon germanium doped with a P-type dopant, and the second epitaxial region may include silicon doped with an N-type dopant.

In still further embodiments, the first recess region may include inflection points. An upper width of the first recessed region adjacent to a surface of the first fin active region may be greater than a lower width of the first recessed region.

Some embodiments of the present inventive concept provide semiconductor devices including fin active regions extending in parallel with each other in a first direction, gate patterns extending in parallel with each other in a second direction perpendicular to the first direction, the gate patterns intersecting the fin active regions, wherein the gate patterns include butting gate patterns overlapping both ends of the fin active regions, and source/drain regions formed in the fin active regions between the gate patterns. The source/drain regions may include inflection points so that width of a portion adjacent to surface of the fin active region is greater than width of a portion located in the fin active regions.

Further embodiments of the present inventive concept provide semiconductor devices including gate patterns extending in parallel with each other in a first direction; and source/drain regions between the gate patterns. The source/drain regions have upper and lower portions and the lower portion has sidewalls that are vertically flat. The upper and lower portions of the source/drain regions are separated by inflection points so that a width of the upper portion is greater than a width of the lower portion.

In still further embodiments, fin active regions may extend in parallel with each other in a second direction, perpendicular to the first direction so as to intersect the gate patterns, wherein the gate patterns comprise butting gate patterns overlapping both ends of the fin active regions.

In some embodiments, gate spacers may be provided on sidewalls of the gate patterns. The sidewalls of the lower portion of the source/drain regions may be substantially vertically aligned with interfaces between the gate patterns and the gate spacers.

In further embodiments, an isolation region may be provided that defines the fin active regions protruding from a substrate.

In still further embodiments, the fin active region may include a plurality of fin active regions connected in a bridge shape.

In some embodiments, an air space may be provided between the fin active region and the isolation region.

BRIEF DESCRIPTION OF THE DRAWINGS

The foregoing and other features and advantages of the inventive concept will be apparent from the more particular description of preferred embodiments of the inventive concept, as illustrated in the accompanying drawings in which like reference characters refer to the same parts throughout the different views. The drawings are not necessarily to scale, emphasis instead being placed upon illustrating the principles of the inventive concept. In the drawings:

FIGS. 3A and 3B to 31A and 31B are cross-sections illustrating processing steps in the fabrication of semiconductor devices in accordance with some embodiments of the inventive concept.

DETAILED DESCRIPTION OF THE EMBODIMENTS

Figure 1:
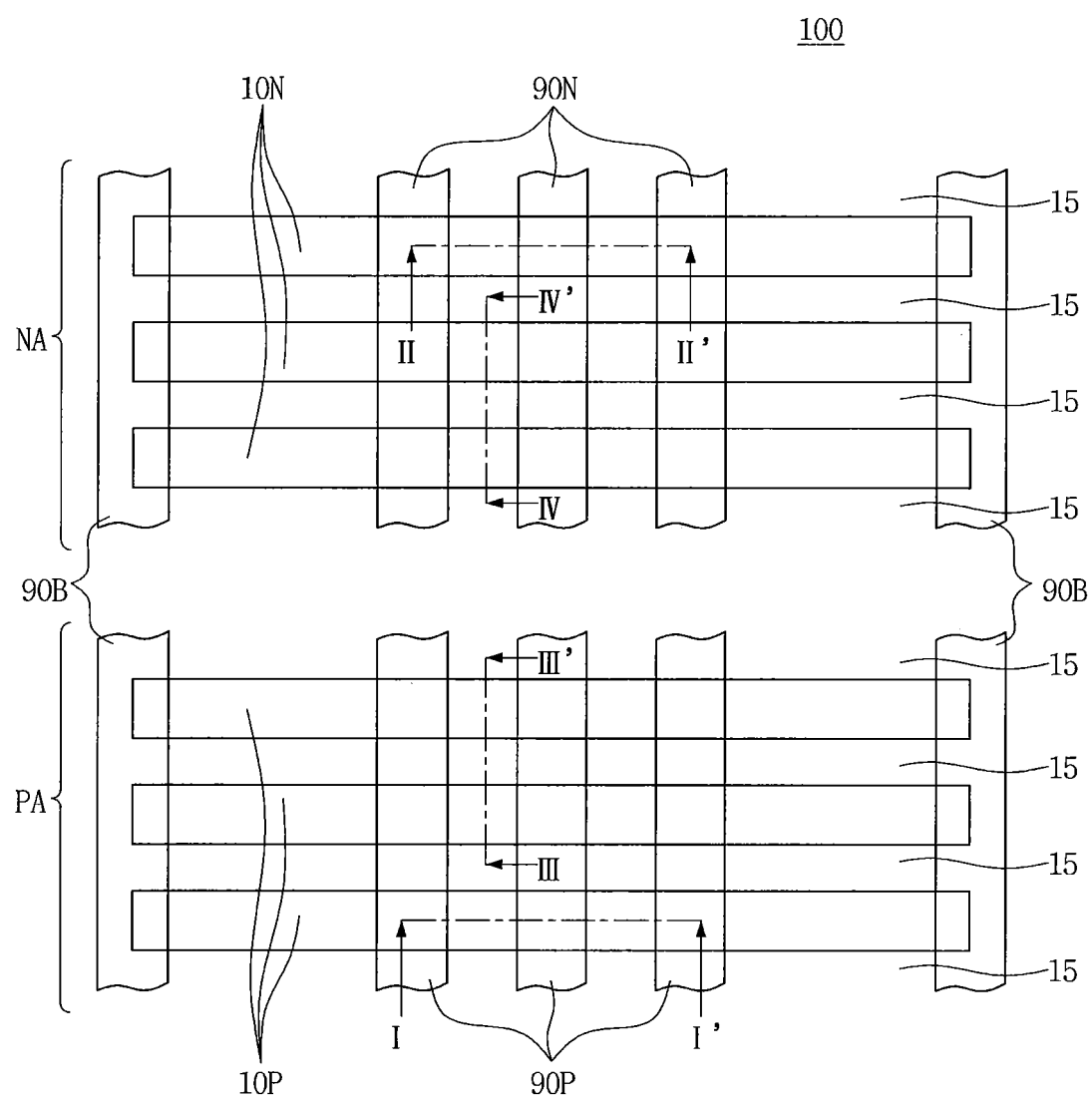
FIG. 1 is a layout of a semiconductor device in accordance with some embodiments of the inventive concept.

Various embodiments will now be described more fully with reference to the accompanying drawings in which some embodiments are shown. The inventive concept may, however, be embodied in different forms and should not be construed as limited to the embodiments set forth herein. Rather, these embodiments are provided so that this disclosure is thorough and complete and fully conveys the inventive concept to those skilled in the art.

The terminology used herein to describe embodiments of the invention is not intended to limit the scope of the invention. The articles "a," "an," and "the" are singular in that they have a single referent; however, the use of the singular form in the present document should not preclude the presence of more than one referent. In other words, elements of the invention referred to in the singular form may number one or more, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on," "connected to," or "coupled to" another element or layer, it can be directly on, connected to, or coupled to the other element or layer or intervening elements or layers may be present. In contrast, when an element is referred to as being "directly on," "directly connected to," or "directly coupled to" another element or layer, there are no intervening elements or layers present. In the following explanation, the same reference numerals denote the same components throughout the specification.

Spatially relative terms, such as "beneath," "below," "lower," "above," "upper," and the like may be used herein to describe the relationship of one element or feature to another, as illustrated in the drawings. It will be understood that such descriptions are intended to encompass different orientations in use or operation in addition to orientations depicted in the drawings. For example, if a device is turned over, elements described as "below" or "beneath" other elements or features would then be oriented "above" the other elements or features. Thus, the term "below" is intended to mean both above and below, depending upon the orientation of the overall device.

Embodiments are described herein with reference to cross-sectional and/or planar illustrations that are schematic illustrations of idealized embodiments and intermediate structures. In the drawings, the sizes and relative sizes of layers and regions may be exaggerated for clarity. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to limit the scope of the present inventive concept.

Like numerals refer to like elements throughout the specification. Accordingly, the same numerals and similar numerals can be described with reference to other drawings, even if not specifically described in a corresponding drawing. Further, when a numeral is not marked in a drawing, the numeral can be described with reference to other drawings.

Referring first to FIG. 1, a layout of a semiconductor device in accordance with some embodiments of the inventive concept will be discussed. As illustrated in FIG. 1, the semiconductor device 100 may be, for example, a p-channel metal oxide semiconductor (PMOS) area PA and or an n-channel metal oxide semiconductor (NMOS) area NA. The semiconductor device 100 may include P-fin active regions 10P and P-gate patterns 90P disposed in the PMOS area PA, and N-fin active regions 10N and N-gate patterns 90N disposed in the NMOS area NA.

The P-fin active regions 10P and the N-fin active regions 10N may be defined by isolation regions 15. For example, the isolation regions 15 may surround the P-fin active regions 10P and the N-fin active regions 10N.

The P-fin active regions 10P and the N-fin active regions 10N may have a line shape, a bar shape, or a stick shape extending in parallel with each other in a first direction, i.e., a horizontal direction.

The P-gate patterns 90P may intersect the P-fin active regions 10P in a second direction, i.e., a vertical direction, and the N-gate patterns 90N may intersect the N-fin active regions 10N in the second direction. The second direction may be perpendicular to the first direction.

Butting gate patterns 90B may be disposed at both ends of the P-fin active regions 10P and the N-fin active regions 10N to overlap the both ends of the P-fin active regions 10P and the N-fin active regions 10N. The P-fin active regions 10P and the N-fin active regions 10N may protrude from a surface of the isolation region 15.

FIGS. 2A to 2D are cross-sections illustrating longitudinal cross-sections of semiconductor devices in accordance with some embodiments of the inventive concept. For example, FIGS. 2A to 2D are longitudinal cross-sections taken along lines I-I' and II-II' of FIG. 1.

Figure 2A:
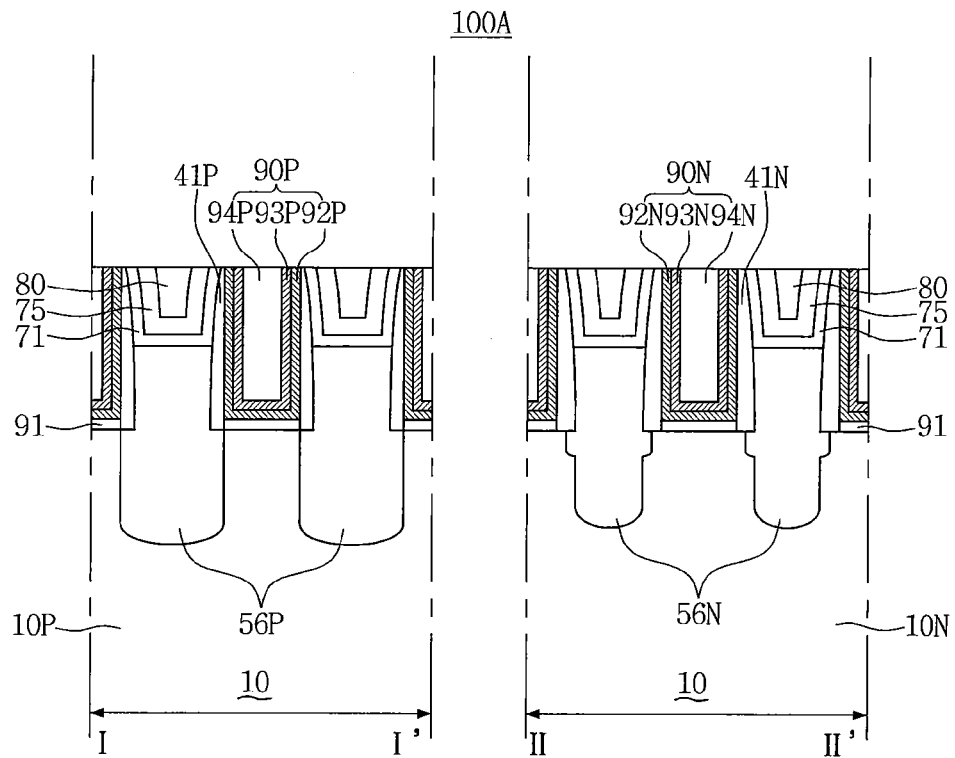
FIGS. 2A to 2D are cross-sections illustrating semiconductor devices in accordance with some embodiments of the inventive concept.

Referring first to FIG. 2A, a semiconductor device 100A in accordance with some embodiments of the inventive concept may include a P-fin active region 10P and an N-fin active region 10N on a substrate 10. The semiconductor device 100A may include P-gate patterns 90P formed on the P-active region 10P and P-source/drain regions 56P formed adjacent to sides of the P-gate patterns 90P in the P-fin active region 10P. Sidewalls of the P-source/drain region 56P may be substantially and vertically flat.

The P-gate patterns 90P may include P-gate insulating layers 92P having a U-shaped cross section and P-gate barrier layers 93P, and P-gate electrodes 94P. The P-gate barrier layers 93P may surround sidewalls and bottoms of the P-gate electrodes 94P, and the P-gate insulating layers 92P may surround outer sidewalls and bottoms of the P-gate barrier layers 93P. The P-gate insulating layers 92P may include at least one of silicon oxide ($SiO_2$) or a metal oxide. The P-gate barrier layers 93P may include at least one of titanium (Ti), titanium nitride (TiN), tantalum (Ta), tantalum nitride (TaN), and another barrier metal. The P-gate electrodes 94P may include at least one of a metal, a metal alloy, or a metal compound.

The semiconductor device 100A may include interface insulating layers 91 between the P-fin active regions 10P and the P-gate insulating layers 92P. The interface insulating layer 91 may include silicon oxide or natively oxidized silicon.

The semiconductor device 100A may include P-gate spacers 41P on outer sidewalls of the P-gate insulating layers 92P. The P-gate spacers 41P may include silicon nitride (SiN).

Upper surfaces of the P-source/drain regions 56P may be located at middle levels of the P-gate patterns 90P. Capping oxide layers 71, stopper layers 75, and interlayer insulating layers 80 may be formed on the P-source/drain regions 56P between the P-gate patterns 90P. The capping oxide layers 71 and the stopper layers 75 may be conformally formed on the P-gate spacers 41P.

Upper surfaces of the P-gate patterns 90P, the capping oxide layers 71, and the stopper layers 75 may be coplanar.

The sidewalls of the P-source/drain regions 56P may be substantially aligned with the boundaries between the P-gate insulating layers 92P and the P-gate spacers 41P.

The semiconductor device 100A may include N-gate patterns 90N formed on the N-fin active region 10N and N-source/drain regions 56N formed adjacent to sides of the N-gate patterns 90N in the N-fin active region 10N. Upper widths of the N-source/drain regions 56N may be greater than lower widths of the N-source/drain regions 56N. For example, the sidewalls of the N-source/drain regions 56N may include inflection points. A width of the N-source/drain region 56N adjacent to the upper surface of the N-fin active region 10N may be the largest width of the N-source/drain regions 10N.

The N-gate patterns 90N may include N-gate insulating layers 92N and N-gate barrier layers 93N having U-shaped cross-sections, and N-gate electrodes 94N. The N-gate barrier layers 93N may surround sidewalls and bottoms of the N-gate electrodes 92N, and the N-gate insulating layers 92N may surround outer surfaces and bottoms of the N-gate barrier layers 93N. The N-gate insulating layers 92N may include at least one of silicon oxide ($SiO_2$) and a metal oxide. The N-gate barrier layers 93N may include at least one of titanium (Ti), titanium nitride (TiN), tantalum (Ta), tantalum nitride (TaN), or another barrier metal. The N-gate electrodes 94N may include at least one of metals such as tungsten (W), a metal alloy, or a metal compound.

The semiconductor device 100A may further include interface insulating layers 91 between the N-fin active region 10N and the N-gate insulating layers 92N. The interface insulating layer 91 may include silicon oxide (SiO2) or natively oxidized silicon.

The semiconductor device 100A may further include N-gate spacers 41N on outer sidewalls of the N-gate insulating layers 92N. The N-gate spacers 41N may include silicon nitride (SiN).

Upper surfaces of the N-source/drain region 56N may be located at middle levels of the N-gate patterns 90N. Capping oxide layers 71, stopper layers 75, and interlayer insulating layers 80 may be formed on the N-source/drain regions 56N between the N-gate patterns 90N. The capping oxide layers 71 and the stopper layers 75 may be conformally formed on the N-gate spacers 41N.

Upper surfaces of the N-gate patterns 90N, the capping oxide layers 71, and the stopper layers 75 may be coplanar.

Sidewalls of the N-source/drain regions 56N may be vertically overlapped by and aligned with the N-gate spacers 41N.

The P-gate spacers 41P may be smaller or thinner than the N-gate spacers 41N.

The P-source/drain regions 56P may be wider and/or deeper than the N-source/drain regions 56N.

Figure 2B:
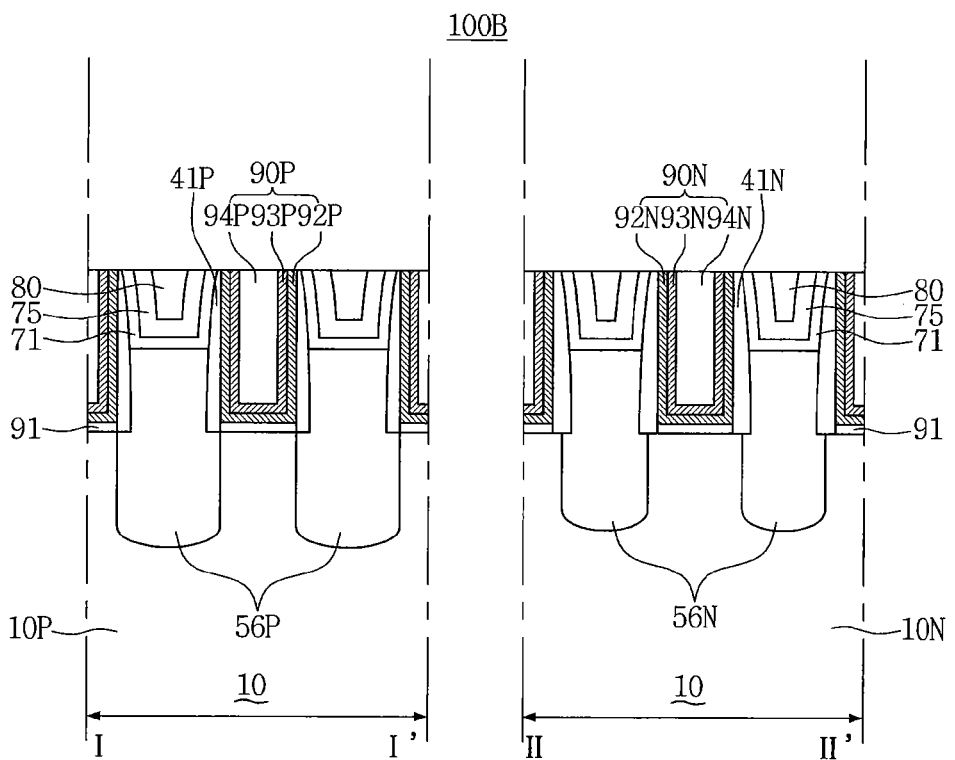

Referring to FIG. 2B, a semiconductor device 100B in accordance with some embodiments of the inventive concept, in comparison with the semiconductor device 100A shown in FIG. 2A, may include N-source/drain regions 56N having substantially vertically flat sidewalls. P-source/drain regions 56P may be wider and/or deeper than the N-source/drain regions 56N.

Figure 2C:
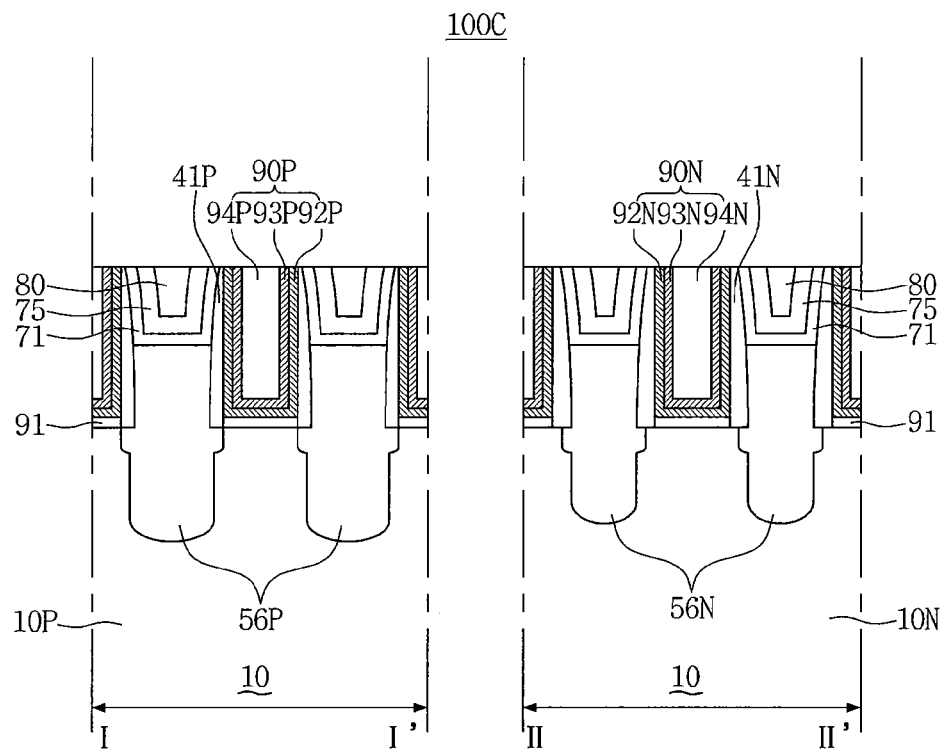

Referring to FIG. 2C, a semiconductor device 100C in accordance with some embodiments of the inventive concept, in comparison with the semiconductor device 100A shown in FIG. 2A, may include P-source/drain regions 56P having upper widths greater than lower widths. For example, sidewalls of the P-source/drain regions 56P may include inflection points 97.

Figure 2D:
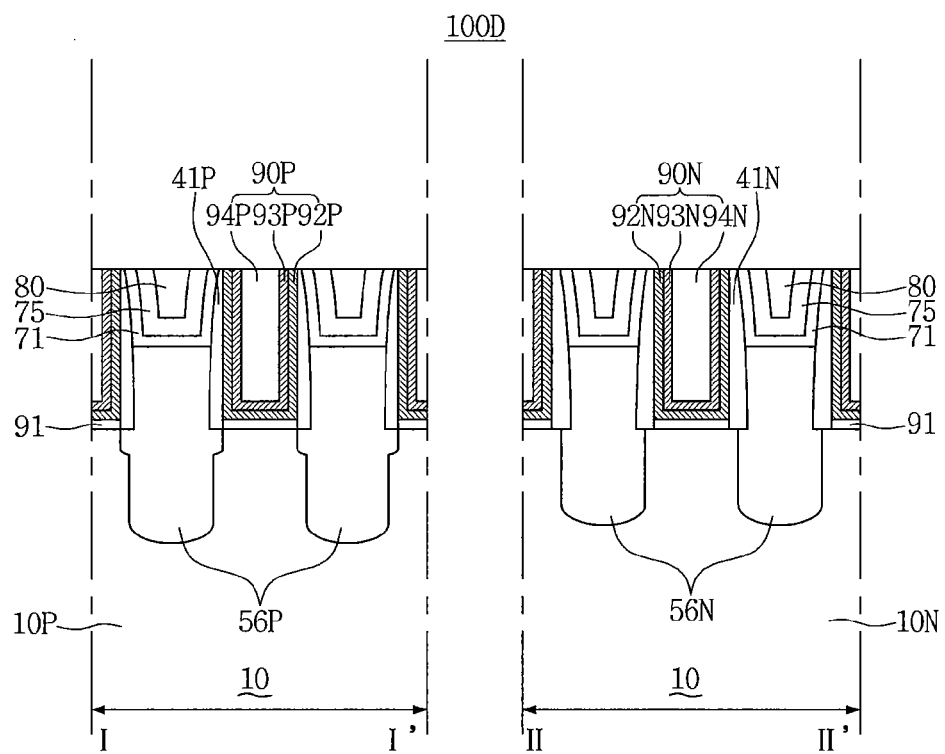

Referring to FIG. 2D, a semiconductor device 100D in accordance with some embodiments of the inventive concept, in comparison with the semiconductor devices 100A and 100B shown in FIGS. 2A and 2B, may include P-source/drain regions 56P having upper widths greater than lower widths, similar to the semiconductor device 100C shown in FIG. 2C, and in comparison with the semiconductor devices 100A and 100C shown in FIGS. 2A and 2C, may include N-source/drain region 56N having substantially and vertically flat sidewalls, similar to the semiconductor device 100B shown in FIG. 2B. For example, the sidewalls of the P-source/drain regions 56P may include inflection points.

FIGS. 3A and 3B to 15A and 15B are longitudinal cross-sections illustrating processing steps in the fabrication of semiconductor devices in accordance with some embodiments of the inventive concept. For example, FIGS. 3A to 15A are longitudinal cross-sections taken along the lines I-I' and II-II' in FIG. 1, and FIGS. 3B to 15B are longitudinal cross-sections taken along lines and IV-IV' in FIG. 1.

Figure 3A:
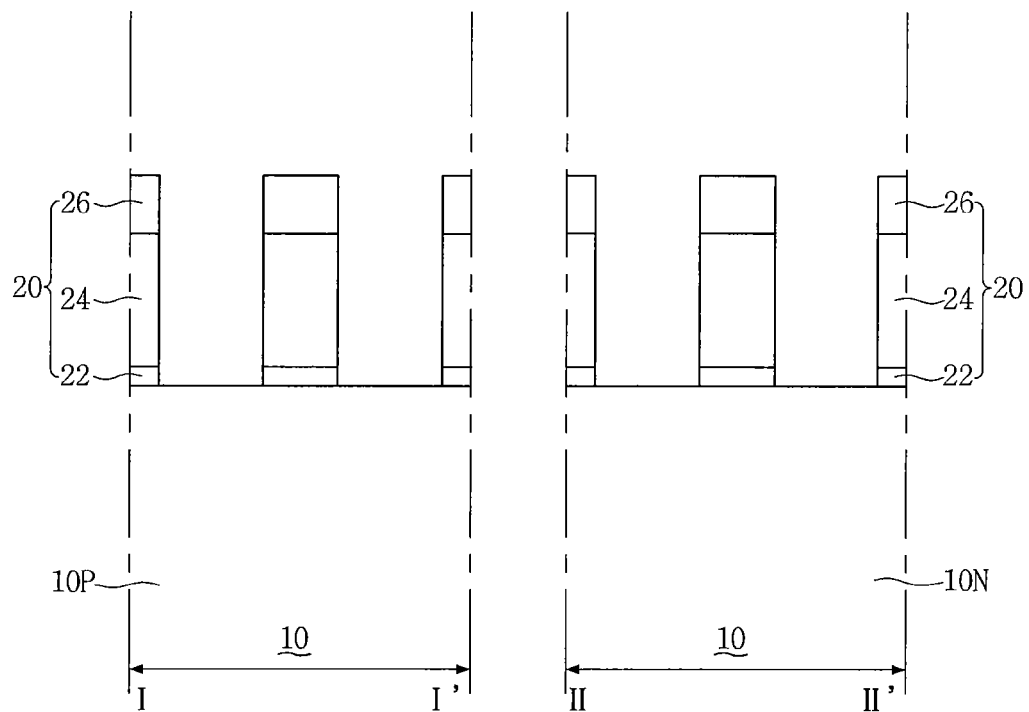
Figure 3B:
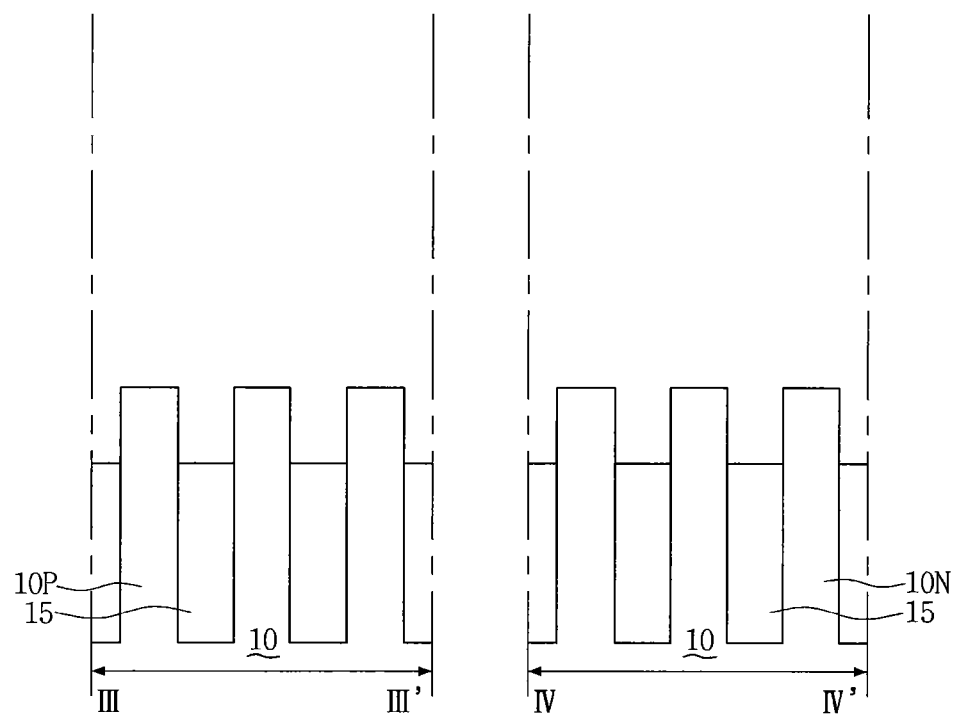

Referring first to FIGS. 1, 3A, and 3B, a method of forming a semiconductor device in accordance with some embodiments of the inventive concept may include forming P-fin active regions 10P and N-fin active regions 10N on a substrate 10, and forming sacrificial gate patterns 20 on the P-fin active regions 10P and the N-fin active regions 10N.

Isolation regions 15 may be disposed between the P-fin active regions 10P and between the N-fin active regions 10N. The P-fin active regions 10P and the N-fin active regions 10N may protrude from upper surfaces of the isolation regions 15. The isolation regions 15 may include silicon oxide ($SiO_2$).

The sacrificial gate patterns 20 may include sacrificial gate insulating layers 22 formed directly on the P-fin active regions 10P and the N-fin active regions 10N, sacrificial gate electrodes 24 formed on the sacrificial gate insulating layer 22, and hard masks 26 formed on the sacrificial gate electrodes 24. The sacrificial gate insulating layers 22 may include silicon oxide (SiO2). The sacrificial gate electrodes 24 may include polycrystalline silicon (poly-Si). The hard masks 26 may include silicon nitride (SiN).

Figure 4A:
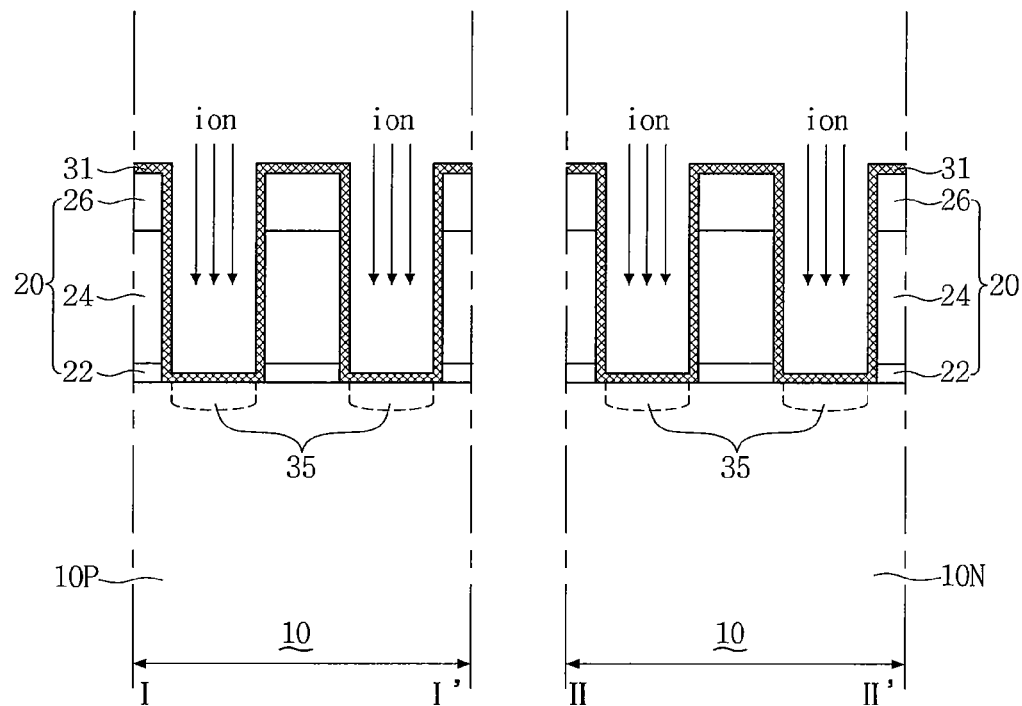
Figure 4B:
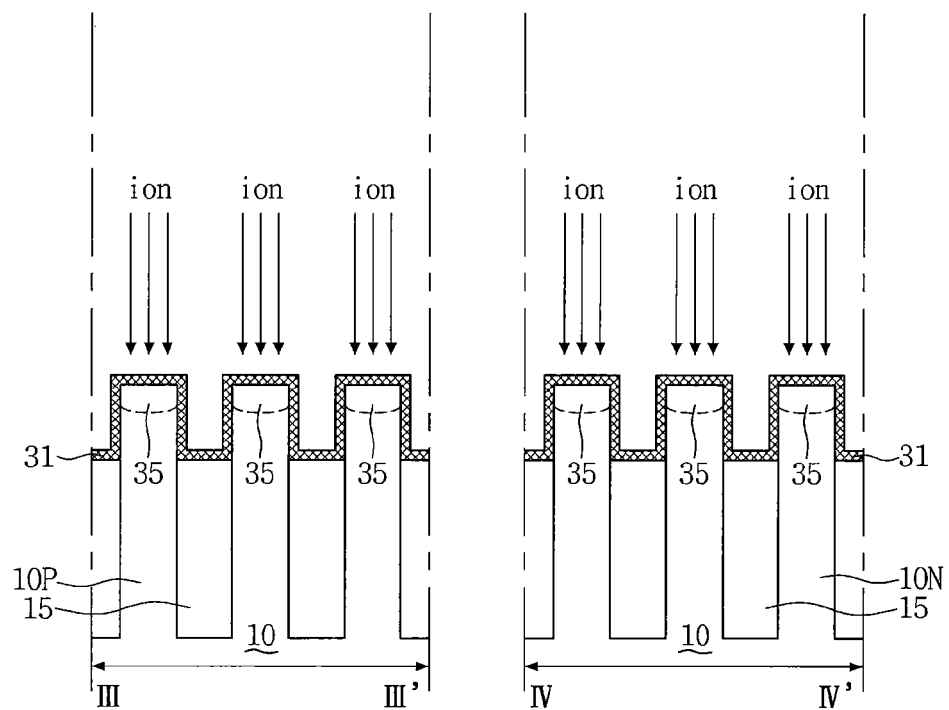

Referring to FIGS. 1, 4A, and 4B, the method may further include forming an ion implantation buffer layer 31 on the P-fin active regions 10P and the N-fin active regions 10N, and performing a blanket ion implantation process to form ion implanted regions 35 in the P-fin active regions 10P and the N-fin active regions 10N.

The ion implantation buffer layer 31 may be entirely formed on the sacrificial gate patterns 20, the isolation regions 15, and the P-fin active regions 10P and the N-fin active regions 10N. The ion implantation buffer layer 31 may include silicon oxide (SiO2). The ion may include at least one of phosphorous (P) ions, arsenic (As) ions, or boron (B) ions. For example, in the embodiments, it is assumed that the ions may include phosphorous (P) ions.

The ion implanted regions 35 may be formed between the sacrificial gate patterns 20. The blanket ion implantation process may be performed using a relatively lower acceleration voltage in comparison with a conventional ion implantation process for forming conventional source/drain regions. Accordingly, the ion implanted regions 35 may be formed adjacent to the surfaces of the P-fin active regions 10P and the N-fin active regions 10N.

Figure 5A:
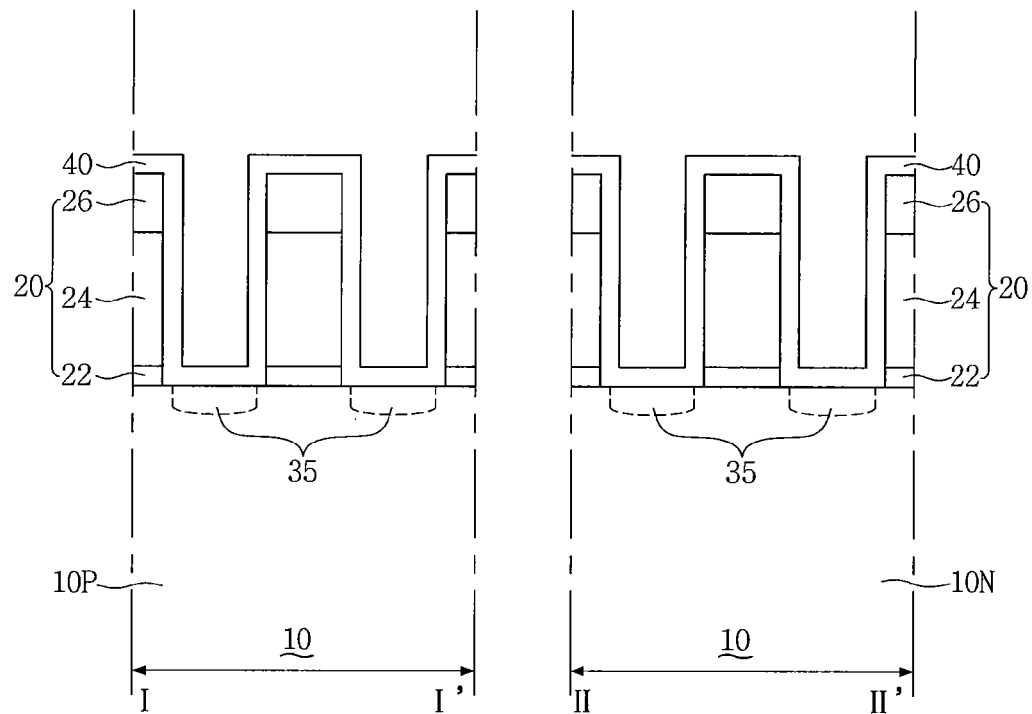
Figure 5B:
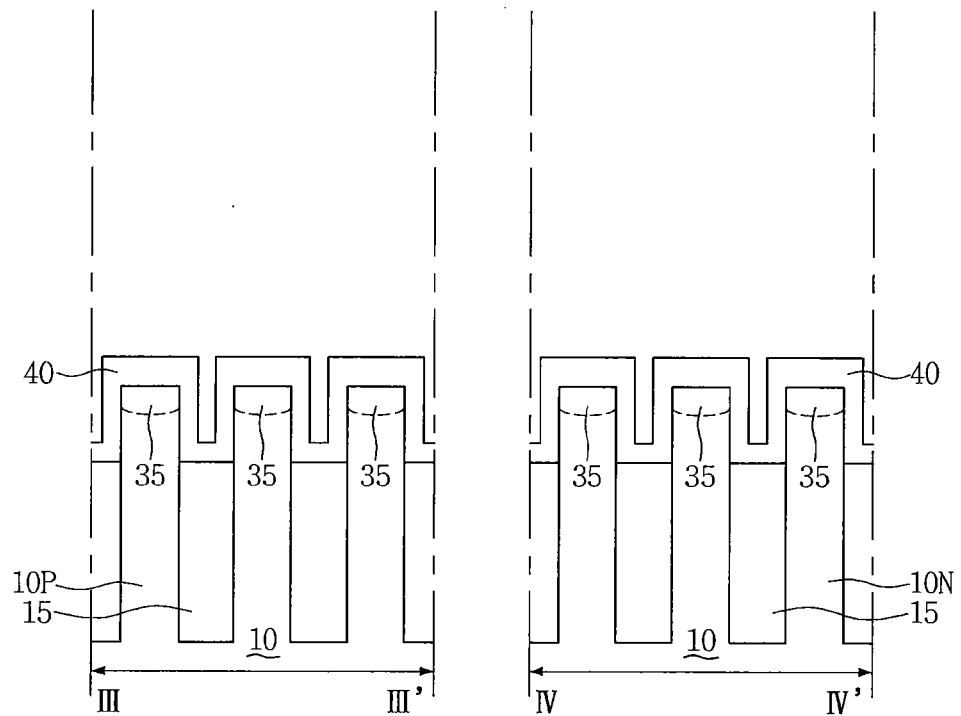

Referring to FIGS. 1, 5A, and 5B, the method may include removing the ion implantation buffer layer 31 and entirely forming a spacer material layer 40. The spacer material layer 40 may include silicon nitride (SiN).

Figure 6A:
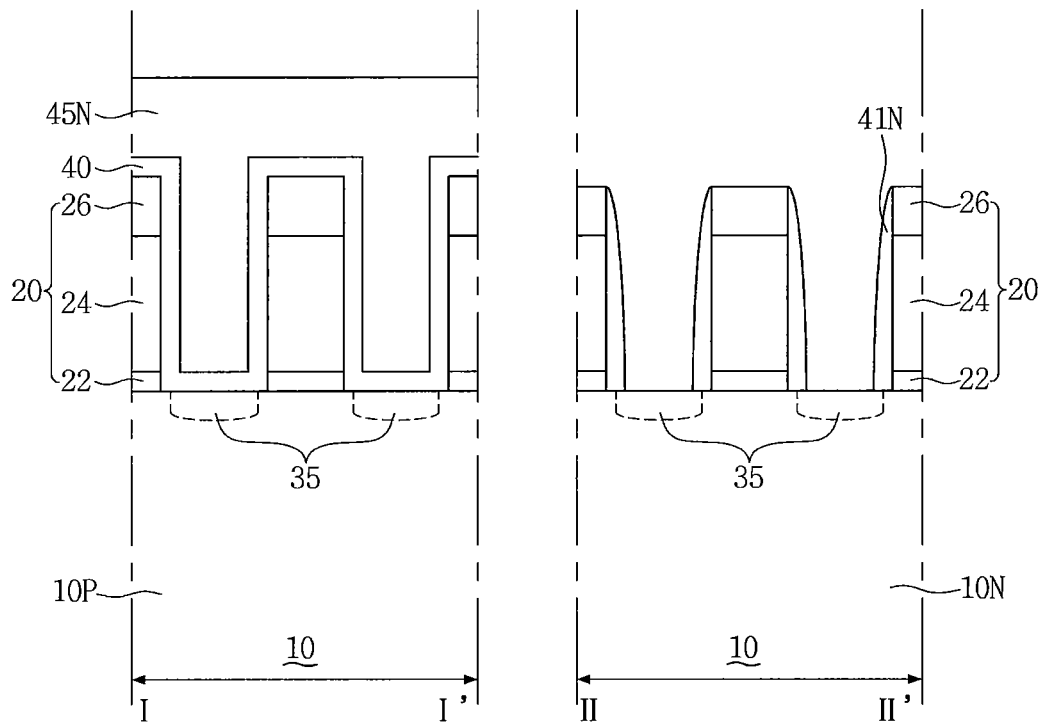
Figure 6B:
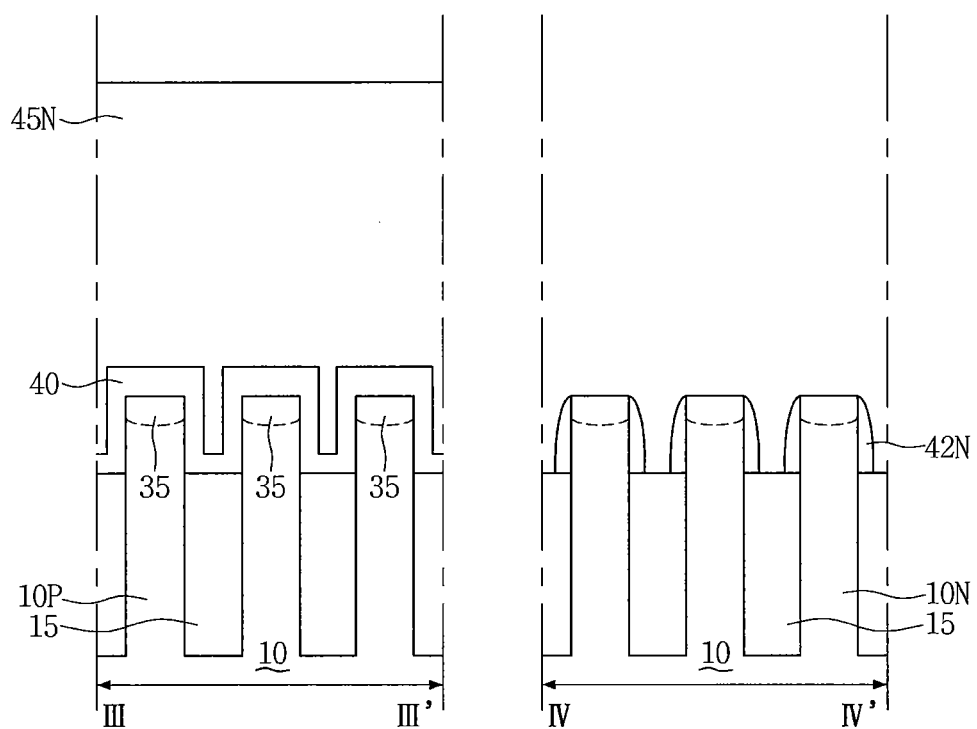

Referring FIGS. 1, 6A, and 6B, the method may include forming an N-open mask 45N covering the PMOS region PA and exposing the NMOS area NA, and performing a spacer etching process to etch the spacer material layer 40 exposed in the NMOS area NA to form N-gate spacers 41N and N-fin active spacers 42N. The hard masks 26 of the NMOS area NA may be thinned. The N-open mask 45N may include a photoresist.

Figure 7A:
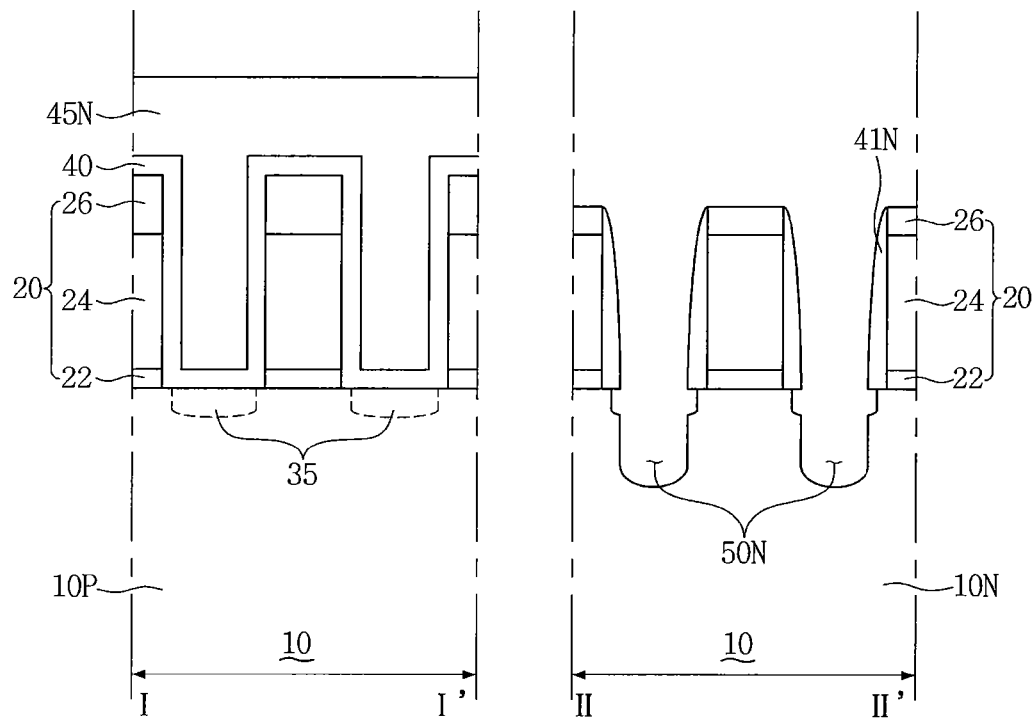
Figure 7B:
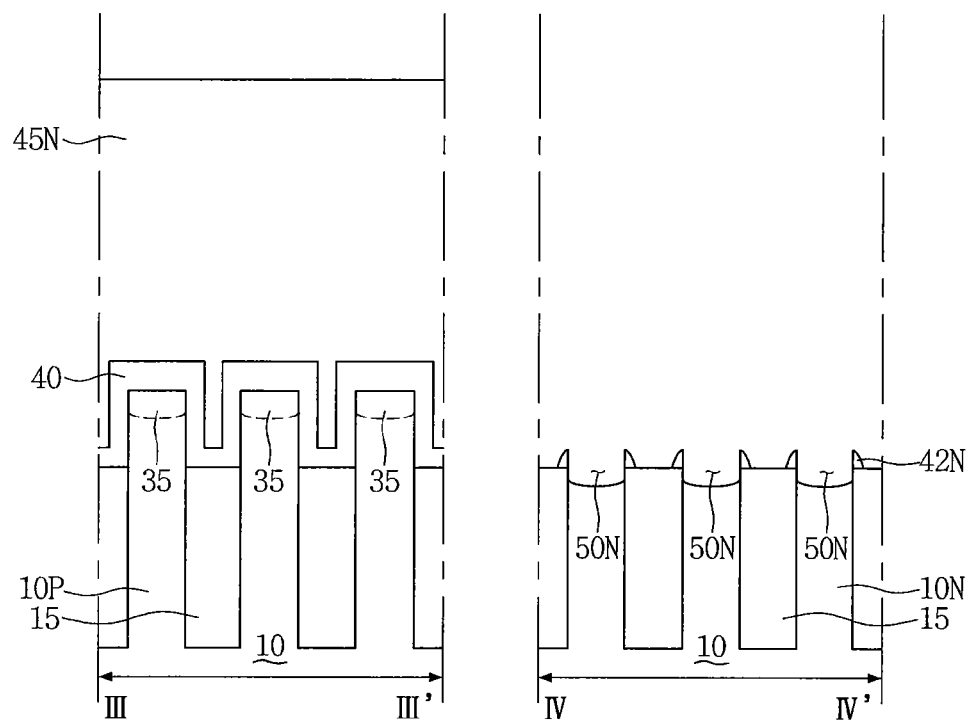

Referring to FIGS. 1, 7A, and 7B, the method may include performing an N-fin active recessing process to etch the N-fin active regions 10N between the N-gate spacers 41N and between the N-fin active spacers 42N to form N-recess regions 50N.

The N-recess regions 50N may be formed deeper and/or wider than the ion implanted regions 35. Upper widths of the N-recess regions 50N may be greater than lower widths. Bottom surfaces of the N-recess regions 50N may be rounded. The N-gate spacers 41N and the N-fin active spacers 42N may be lowered and thinned. The N-fin active recessing process may include an isotropic etching process and anisotropic etching process. The N-open mask 45N may be removed.

Figure 8A:
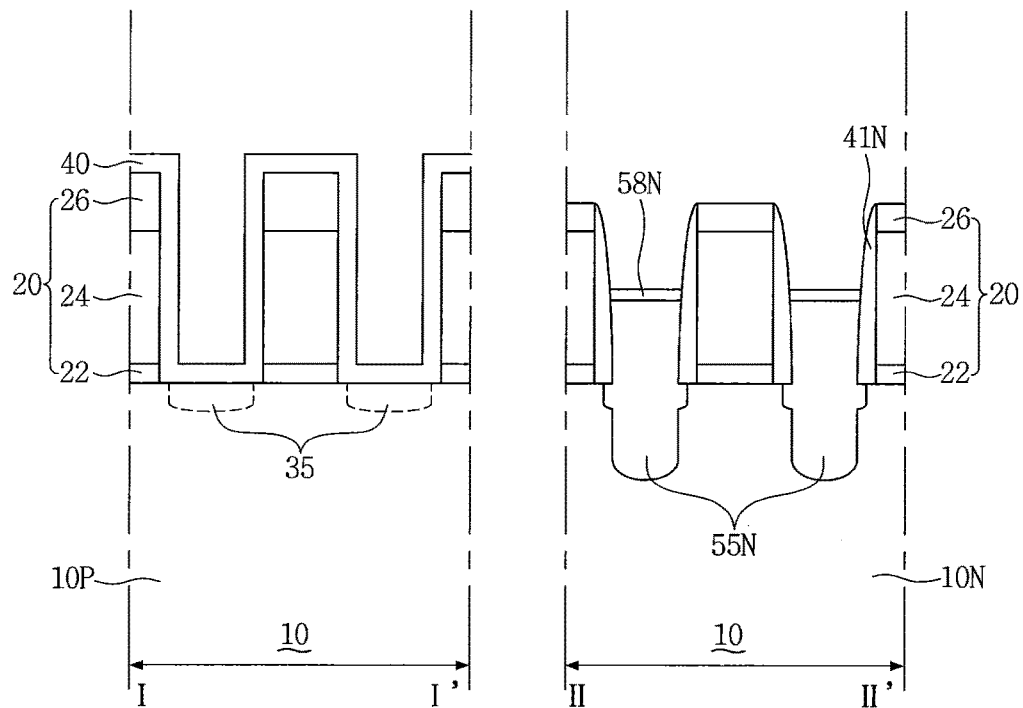
Figure 8B:
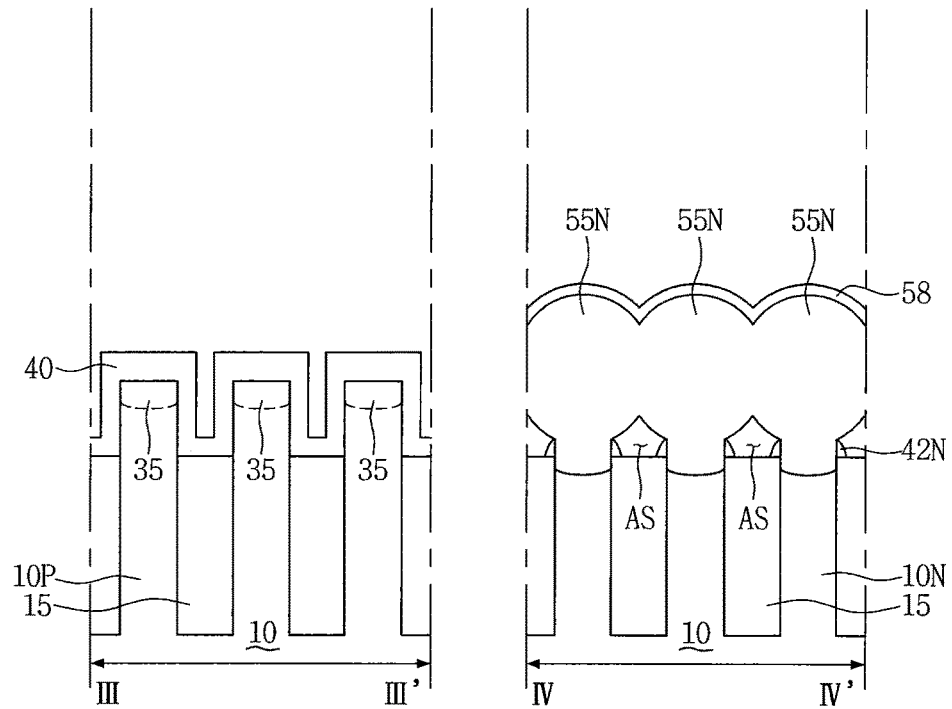

Referring to FIGS. 1, 8A, and 8B, the method may include performing an epitaxial growth process to form N-epitaxial regions 55N in the N-recess regions 50N. The N-epitaxial regions 55N may be connected with each other in a bridge shape. Accordingly, air spaces AS may be formed between the connected N-epitaxial regions 55N and the isolation regions 15. The N-epitaxial regions 55N may have spherically rounded upper surfaces. For example, the N-epitaxial regions 55N may have a cross sectional view of a spherical shape or a ball shape. The N-epitaxial regions 55N may include N-type ions, i.e., phosphorous (P) and/or arsenic (As) doped silicon (Si). Accordingly, the N-epitaxial regions 55N may have conductivity and may be N-source/drain regions 56N.

The method may further include forming N-protection layers 58 on the N-epitaxial regions 55N. The N-protection layers 58 may include silicon oxide (SiO₂). For example, the N-protection layer 58 may include natively oxidized silicon.

Figure 9A:
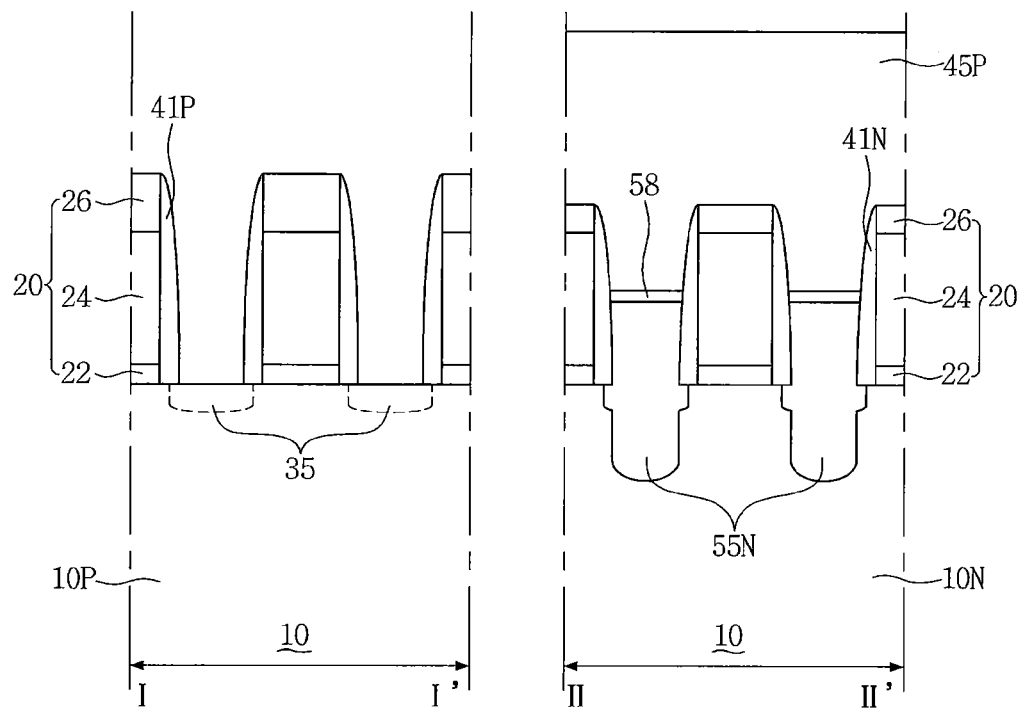
Figure 9B:
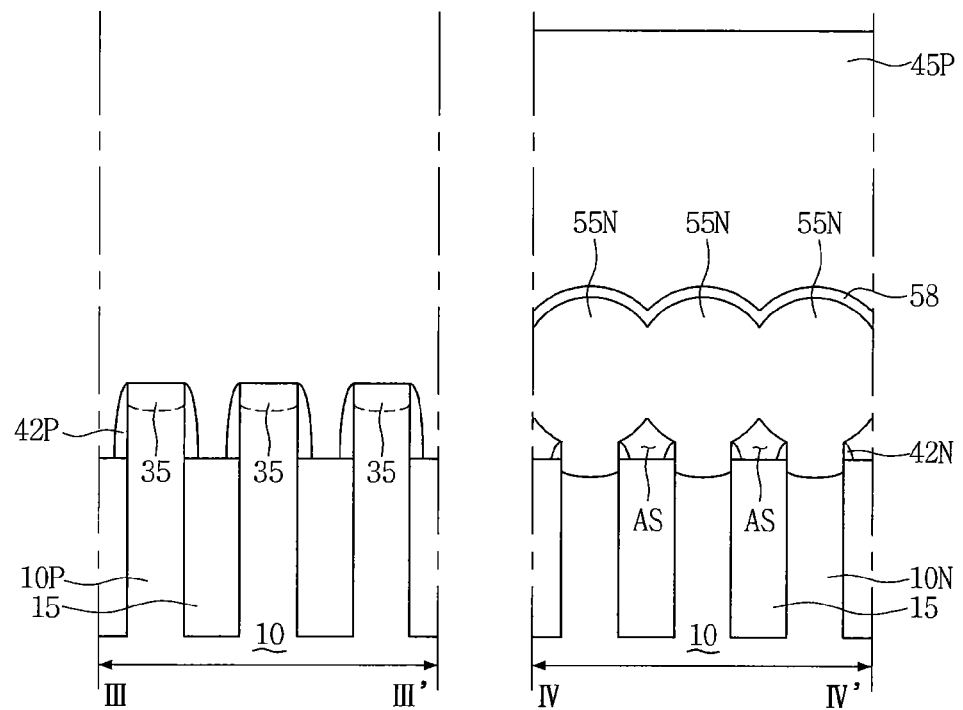

Referring to FIGS. 1, 9A, and 9B, the method may include forming a P-open mask 45P covering the NMOS area NA and exposing the PMOS area PA, and etching the spacer material layer 40 exposed in the PMOS area PA to form P-gate spacers 41P and P-fin active spacers 42P. The hard masks 26 in the PMOS area PA may be thinned. The P-open mask 45P may include a photoresist.

Figure 10A:
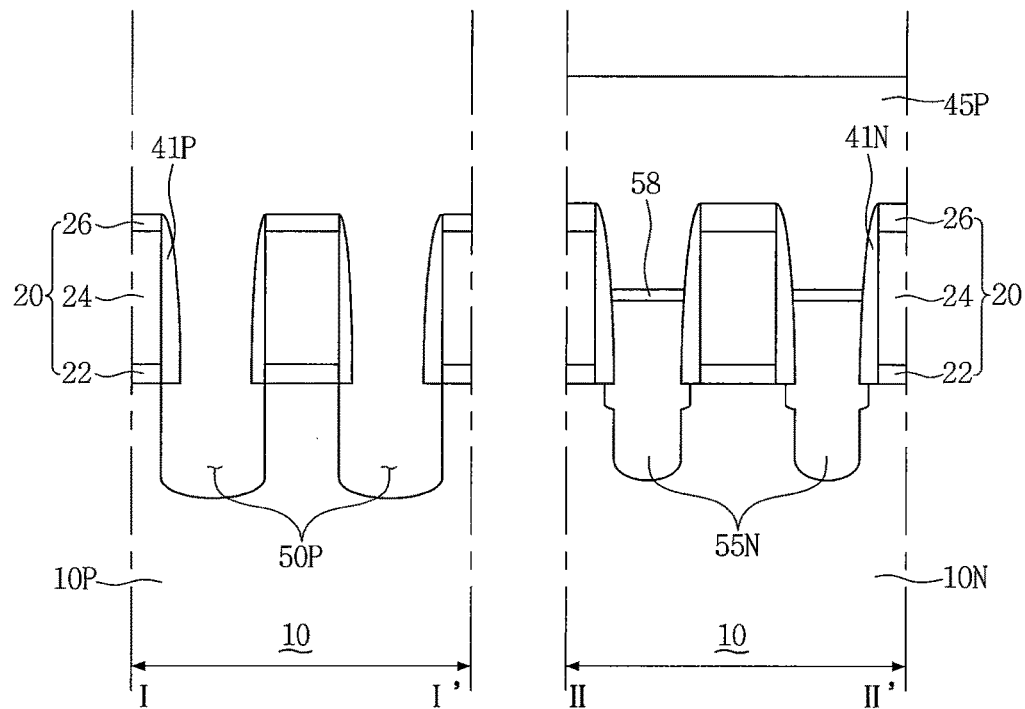
Figure 10B:
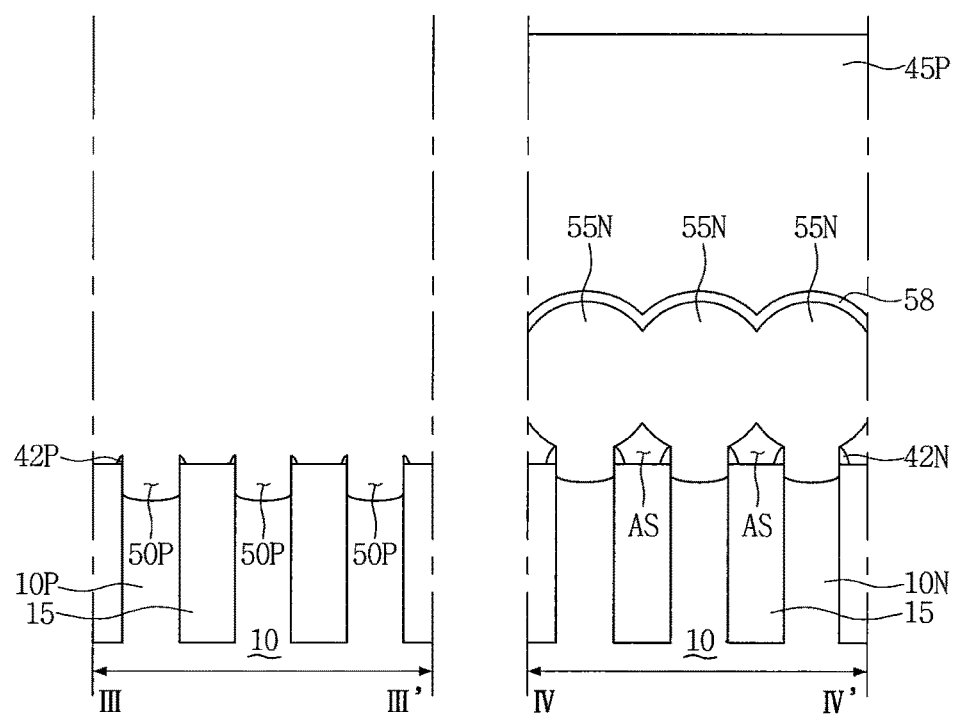

Referring to FIGS. 1, 10A, and 10B, the method may include performing a P-fin active recessing process etching the P-fin active region 10P between the P-gate spacers 41P and between the P-fin active spacers 42P to form P-recess regions 50P.

The P-recess regions 50P may be formed deeper and wider than the N-recess regions 50N. Sidewalls of the P-recess regions 50P may be substantially vertically flat. Bottom surfaces of the P-recess regions 50P may be rounded. The P-gate spacers 41P and the P-fin active spacers 42P may be lower and thinner than the N-gate spacers 41N and the N-fin active spacers 42N. The P-fin active recessing process may include an isotropic etching process and an anisotropic process. The P-open mask 45P may be removed.

Figure 11A:
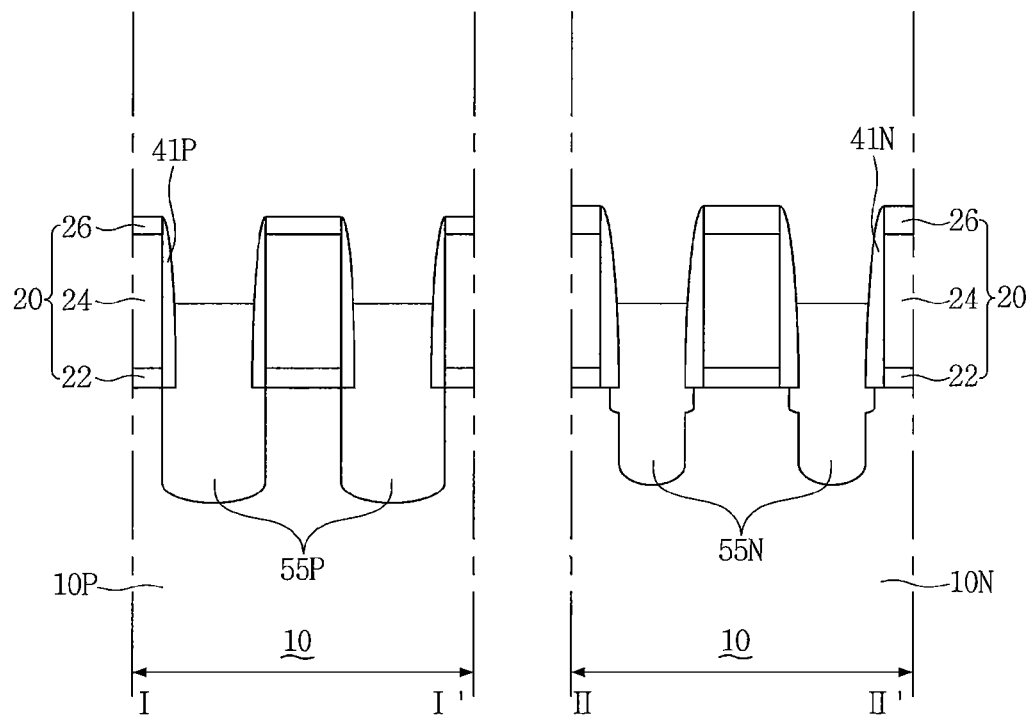
Figure 11B:
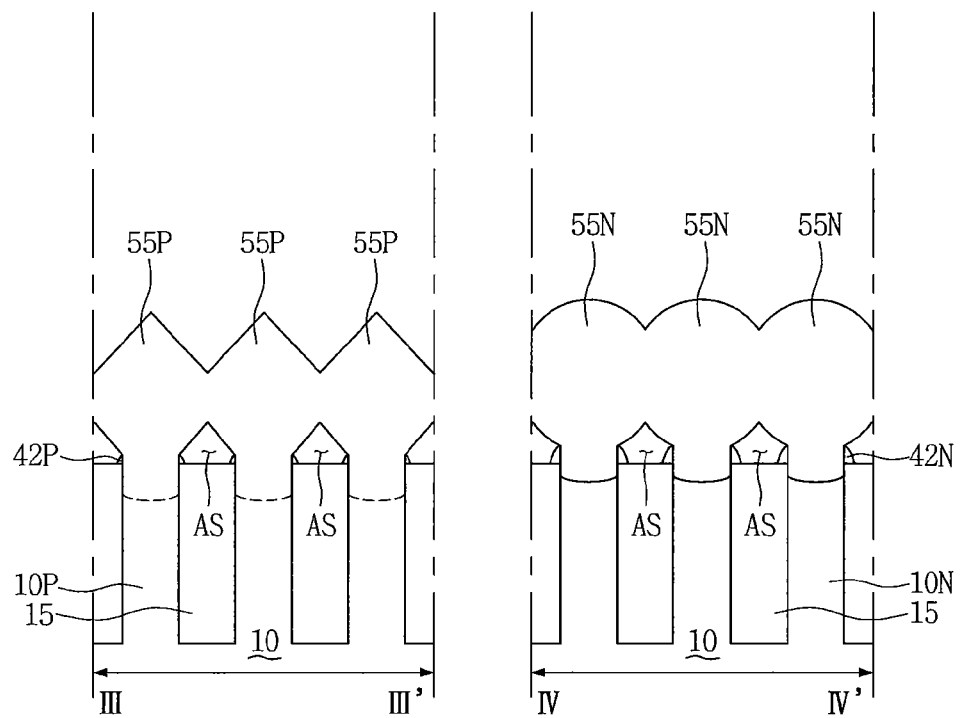

Referring to FIGS. 1, 11A, and 11B, the method may include performing an epitaxial growth process to form P-epitaxial regions 55P in the P-recess regions 50P.

The P-epitaxial regions 55P may be connected with each other in a bridge shape. Accordingly, air spacers AS may be formed between the connected P-epitaxial regions 55P and the isolation regions 15. The P-epitaxial regions 55P may have a diamond shaped cross sectional view. The P-epitaxial regions 55P may have P-type ions, i.e., boron (B) doped silicon germanium (SiGe). Accordingly, the P-epitaxial regions 55P may have conductivity and may be P-source/drain regions 56P. The N-protection layers 58 may be removed.

Figure 12A:
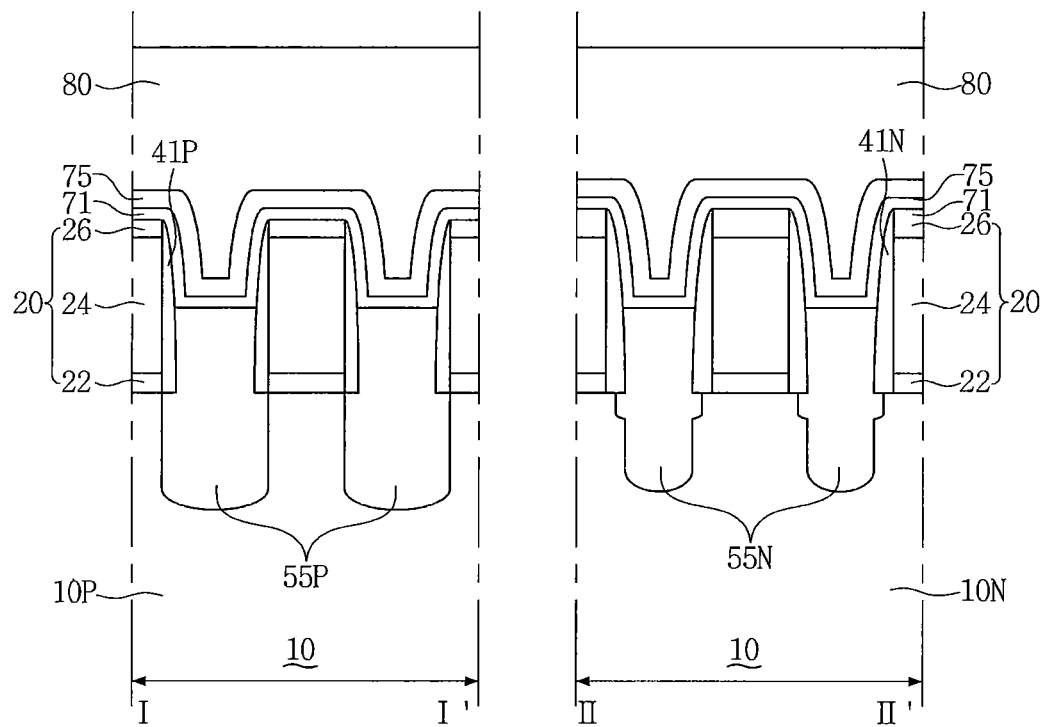
Figure 12B:
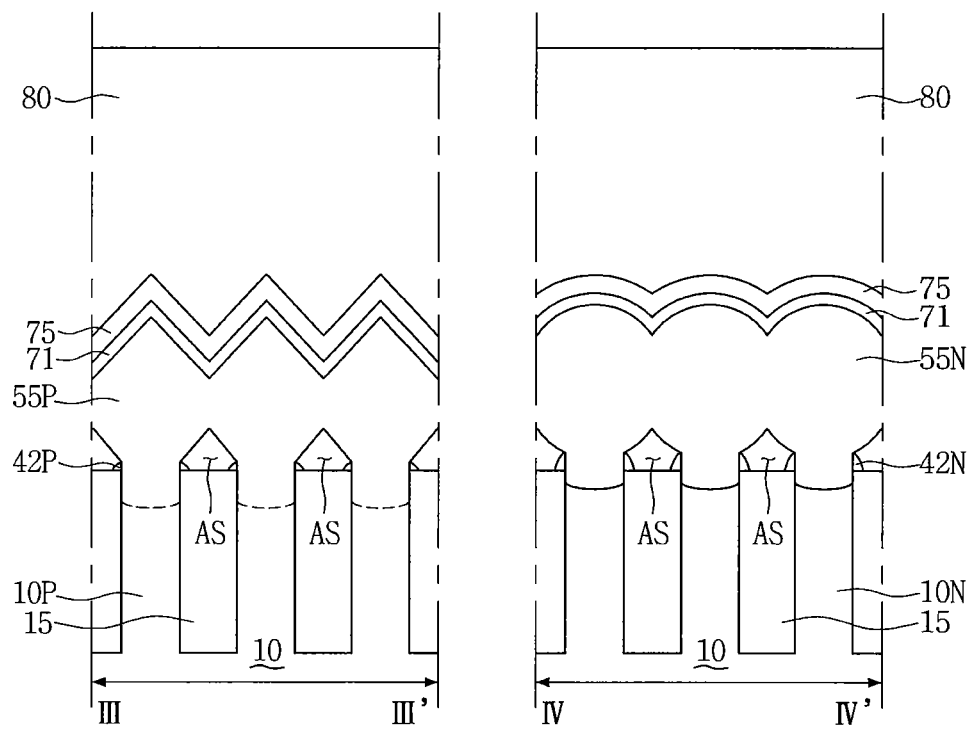

Referring to FIGS. 1, 12A, and 12B, the method may include entirely forming a capping oxide layer 71, a stopper layer 75, and an interlayer insulating layer 80. The capping oxide layer 71 may include silicon oxide (SiO₂). The stopper layer 75 may include silicon nitride (SiN), and the interlayer insulating layer 80 may include silicon oxide (SiO₂) such as tetraethylorthosilicate (TEOS).

Figure 13A:
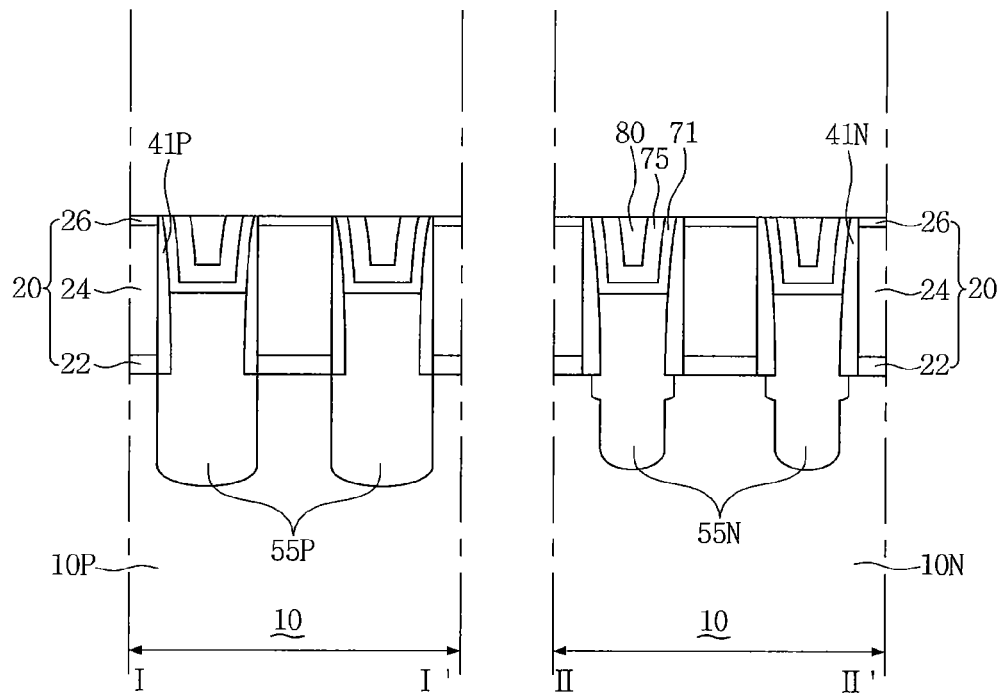
Figure 13B:
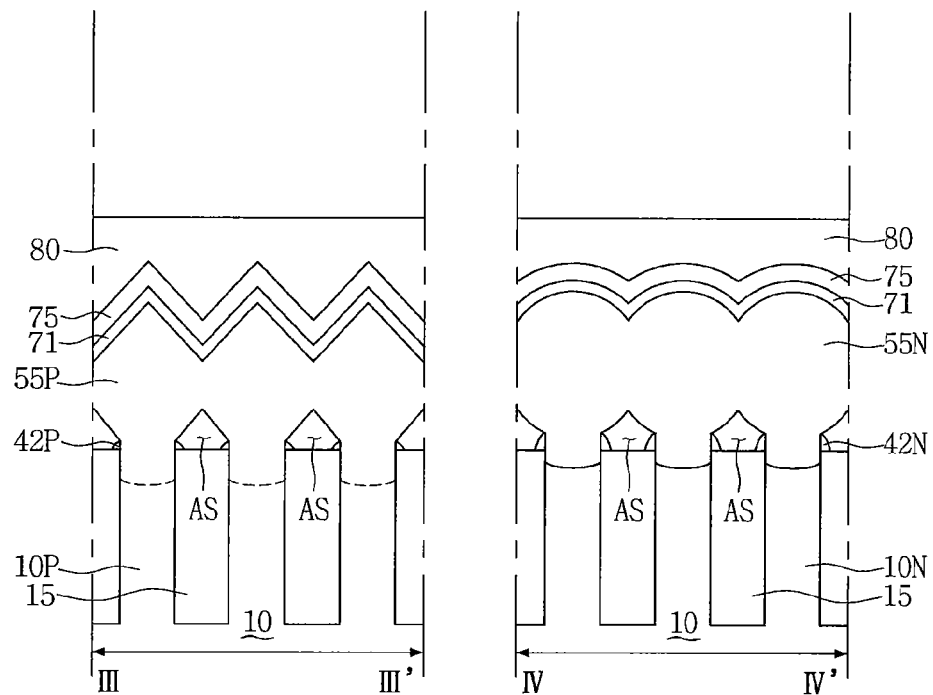

Referring to FIGS. 1, 13A, and 13B, the method may include performing a first chemical mechanical polishing process (CMP) to planarize the interlayer insulating layer 80, the stopper layer 75, and the capping oxide layer 71 to expose the hard masks 26.

Figure 14A:
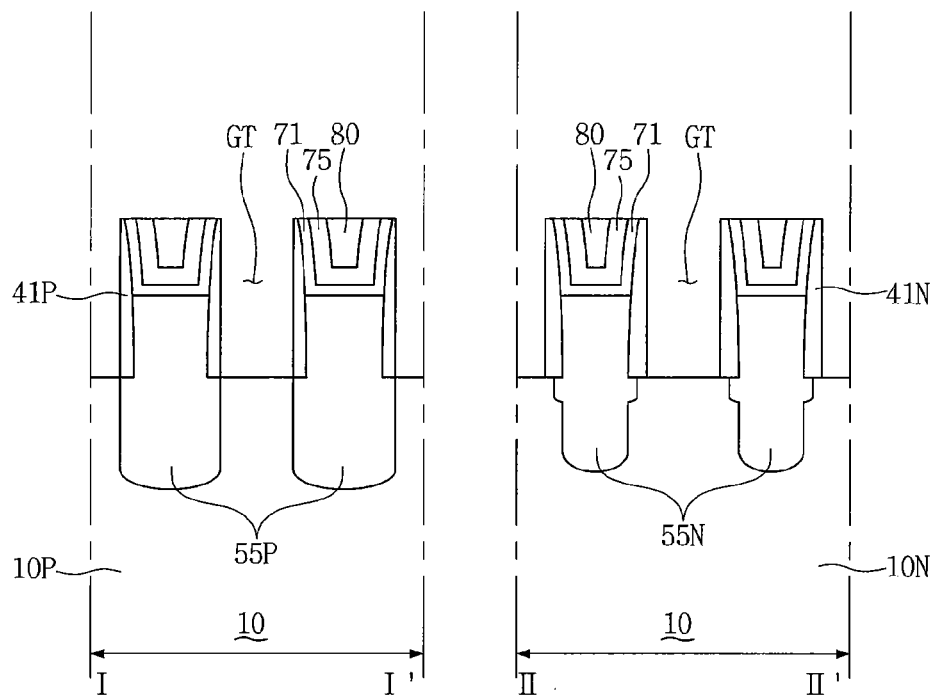
Figure 14B:
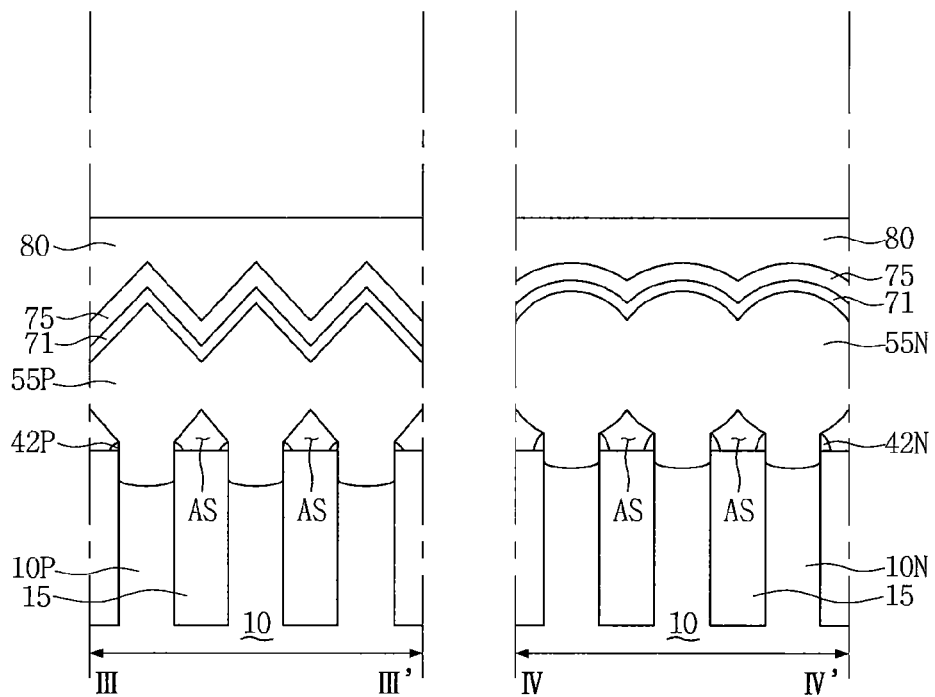

Referring to FIGS. 1, 14A, and 14B, the method may include removing the hard masks 26, the sacrificial gate electrodes 24, and the sacrificial insulating layers 22 to form gate trenches GT.

Figure 15A:
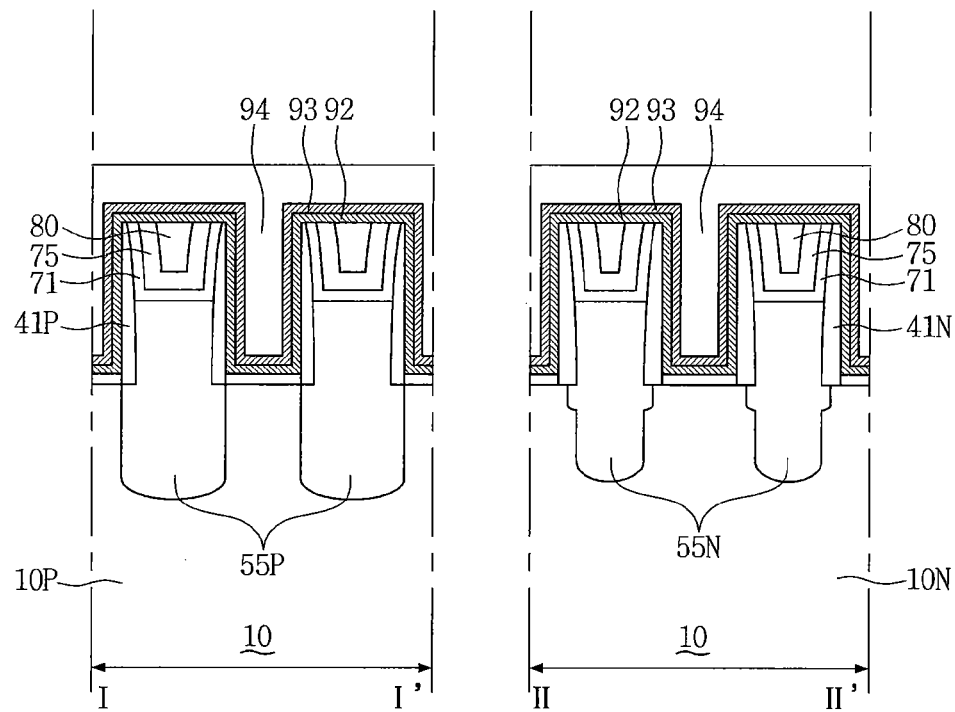
Figure 15B:
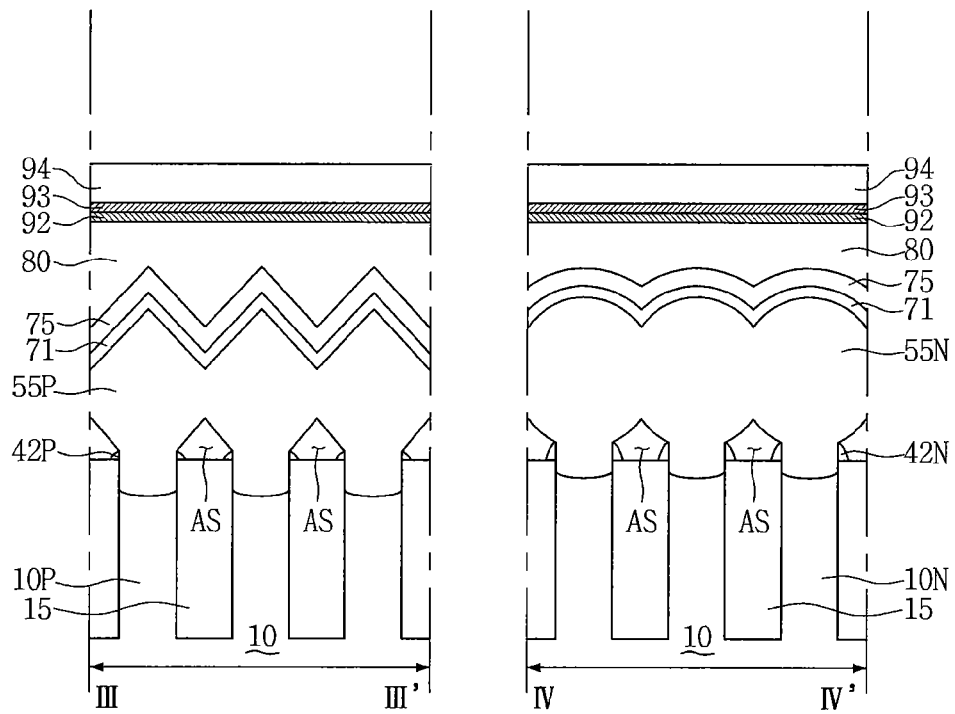

Referring to FIGS. 1, 15A, and 15B, the method may include entirely forming a gate insulating material layer 92, a gate barrier material layer 93, and a gate electrode material layer 94 to fill the gate trenches GT.

The gate insulating material layer 92 may include a metal oxide such as hafnium oxide ($Hf_xO_y$) or aluminum oxide ($Al_xO_y$). The gate barrier material layer 93 may include at least one of titanium (Ti), titanium nitride (TiN), tantalum (Ta), tantalum nitride (TaN), or another barrier material. The gate electrode material layer 94 may include a single layer or multi layers of a metal or a metal compound.

The method may further include forming interlayer insulating layers 91 on surfaces of the P-fin active regions 10P and N-fin active regions 10N exposed in the gate trenches GT before forming the gate insulating material layer 92. The interface insulating layer 91 may include natively oxidized silicon or silicon oxide which is formed by oxidizing the surfaces of the P-fin active regions 10P and the N-fin active regions 10N. In some embodiments, the interface insulating layer 91 may be omitted.

The method may include performing a second chemical mechanical polishing (CMP) process to remove portions of the gate electrode material layer 94, the gate barrier material layer 93, and the gate insulating material layer 92 to form N-gate patterns 90N including N-gate insulating layers 92N, N-gate barrier layers 93N, and N-gate electrodes 94N, and P-gate patterns 90P including P-gate insulating layers 92P, P-gate barrier layers 93P, and P-gate electrodes 94P so that the semiconductor device 100A shown in FIG. 2A may be formed.

FIGS. 16A and 16B to 20A and 20B illustrate longitudinal cross-sections for describing a method of forming a semiconductor device in accordance with some embodiments of the inventive concept. For example, FIGS. 16A to 20A illustrate longitudinal cross-sections taken along the lines I-I' and II-II' of FIG. 1, and FIGS. 16B to 20B illustrate longitudinal cross-sections taken along the lines and IV-IV' of FIG. 1.

Figure 16A:
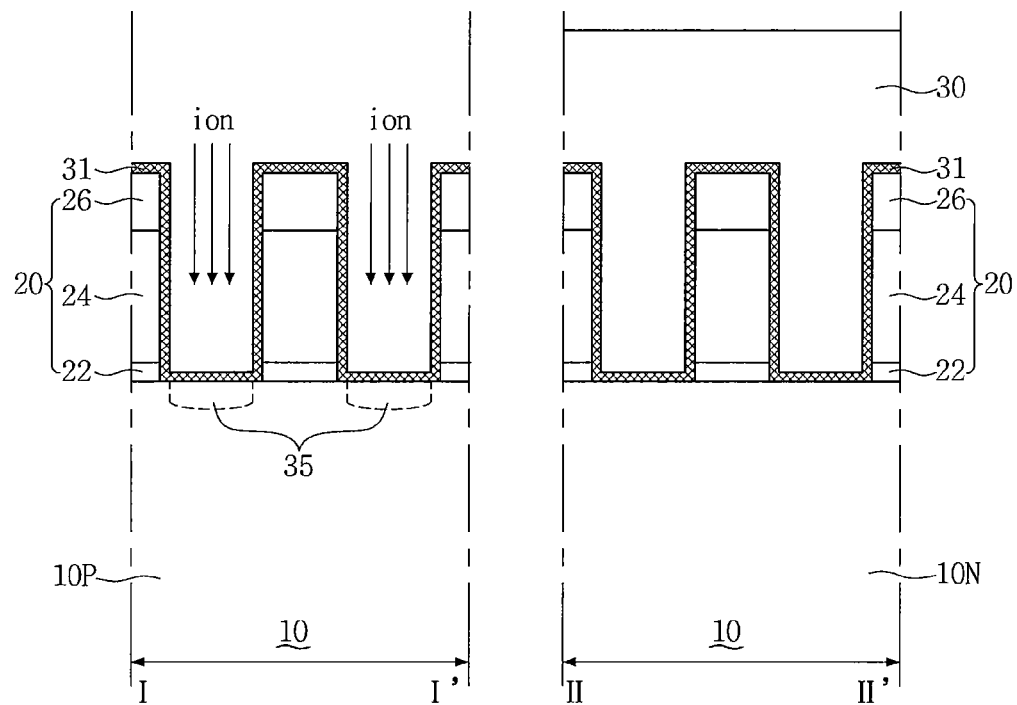
Figure 16B:
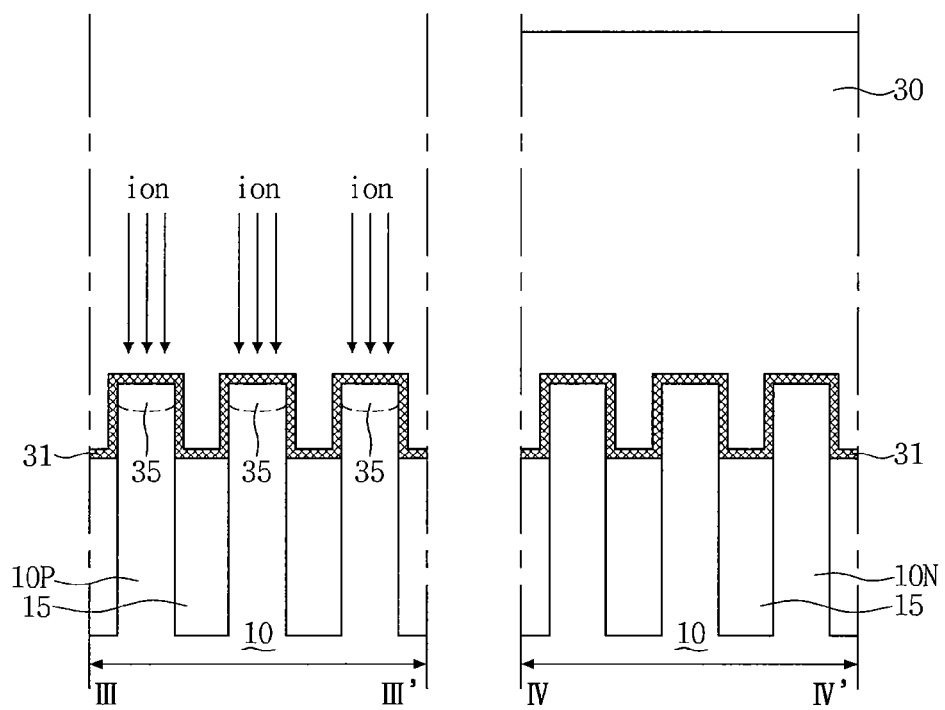

Referring to FIGS. 1, 16A, and 16B, a method of forming a semiconductor device in accordance with some embodiment of the inventive concept may include, by performing the processes described with reference to FIGS. 3A and 3B, forming P-active regions 10P and N-fin active regions 10N defined by isolation regions 15 on the substrate 10, forming sacrificial gate patterns 20 on the P-fin active regions 10P and the N-fin active regions 10N, forming ion implantation buffer layers 31 on the P-fin active regions 10P and the N-fin active regions 10N, forming a mask pattern 30 covering the NMOS area NA and exposing the PMOS area PA, and performing a first ion implantation process to form ion implanted regions 35 in the P-fin active regions 10P.

Figure 17A:
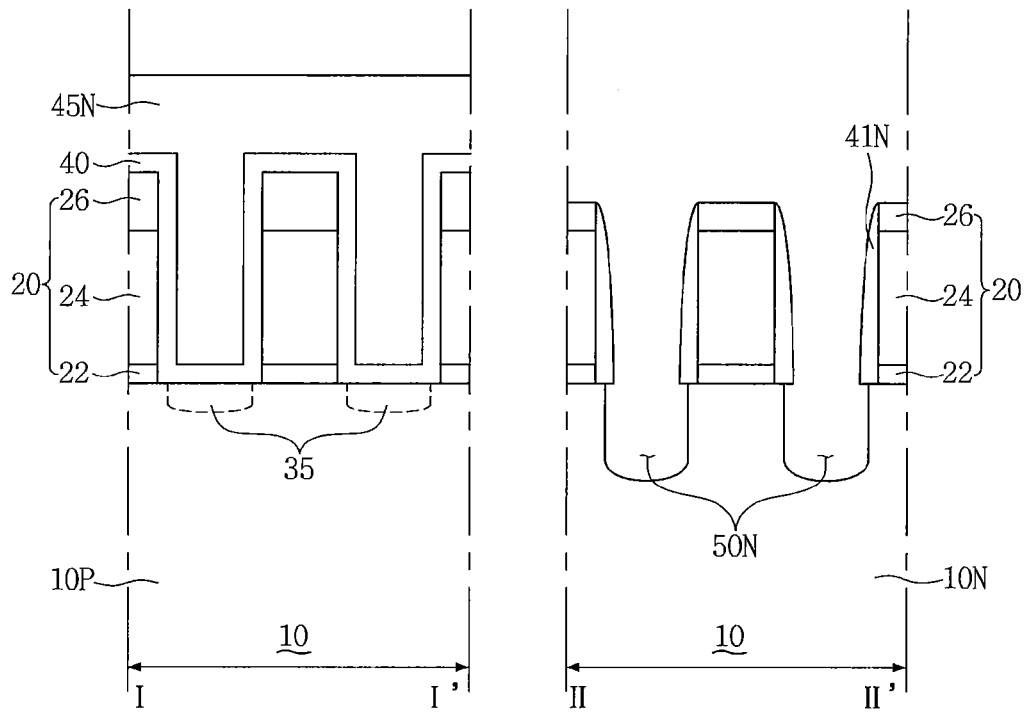
Figure 17B:
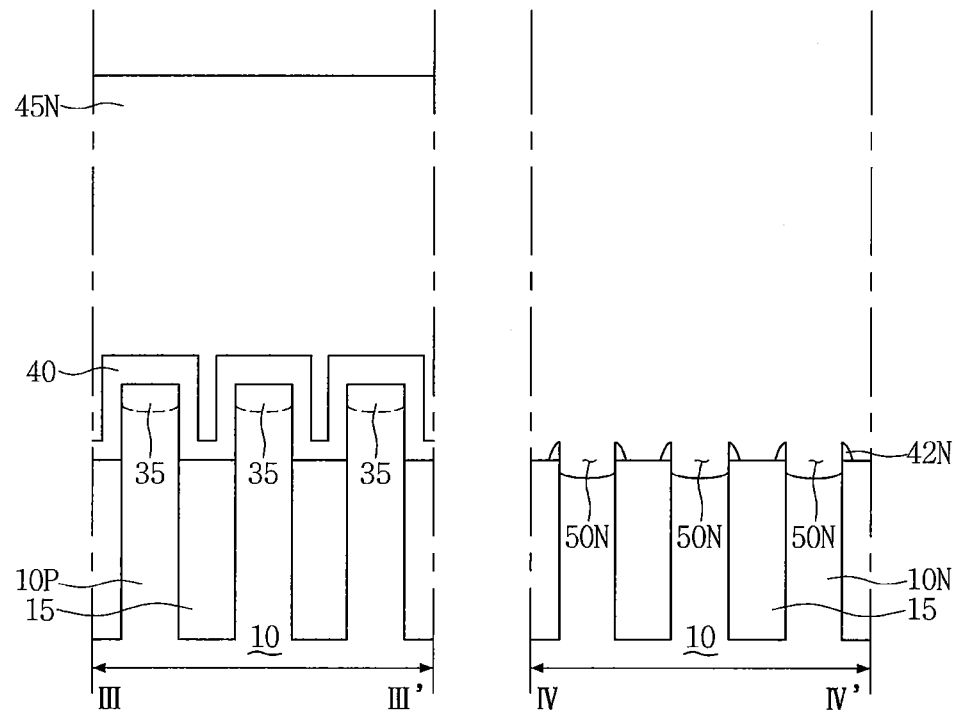

Referring to FIGS. 1, 17A, and 17B, the method may include, by performing the processes described with reference to FIGS. 5A and 5B to 7A and 7B, removing the ion implantation buffer layer 31, entirely forming spacer material layer 40, forming an N-open mask 45N covering the PMOS area and exposing the NMOS area NA, etching the spacer material layer 40 exposed in the NMOS area NA to form N-gate spacers 41N and N-fin active spacers 42N, and performing an N-fin active recessing process for etching the N-fin active regions 10N between the N-gate spacers 41N and between the N-fin active spacers 42N to form N-recess regions 50N. Sidewalls of the N-recess regions 50N may be substantially vertically flat. The sidewalls of the N-recess regions 50N may be vertically aligned with the N-gate spacers 41N to be vertically overlapped. The N-open mask 45N may be removed. Other elements not described can be understood with reference to FIGS. 5A and 5B to 7A and 7B.

Figure 18A:
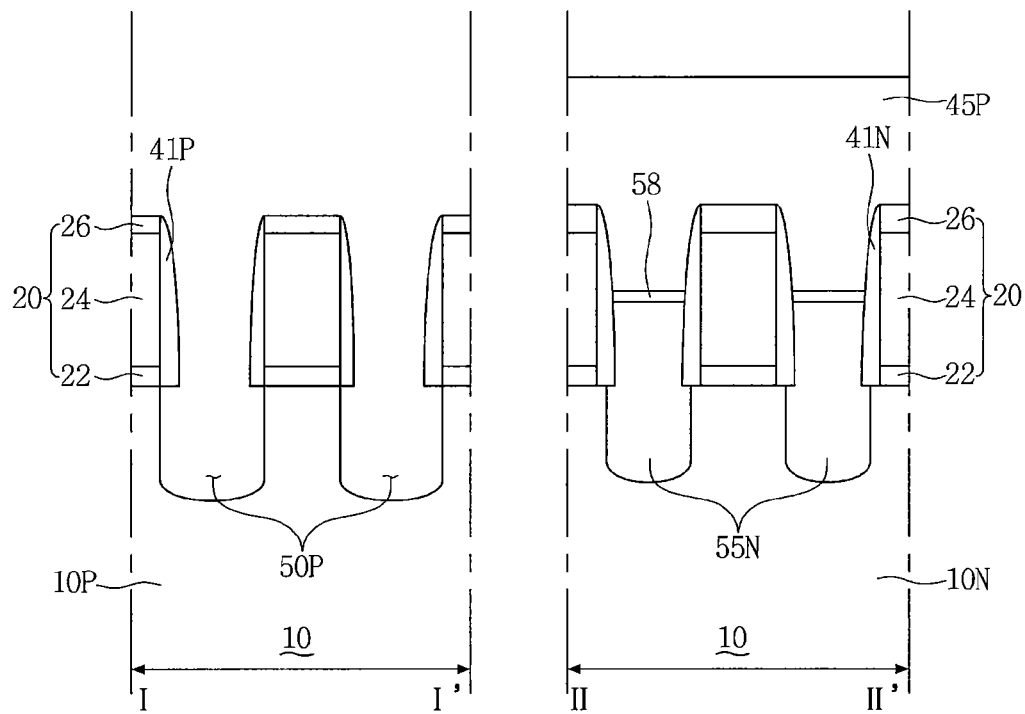
Figure 18B:
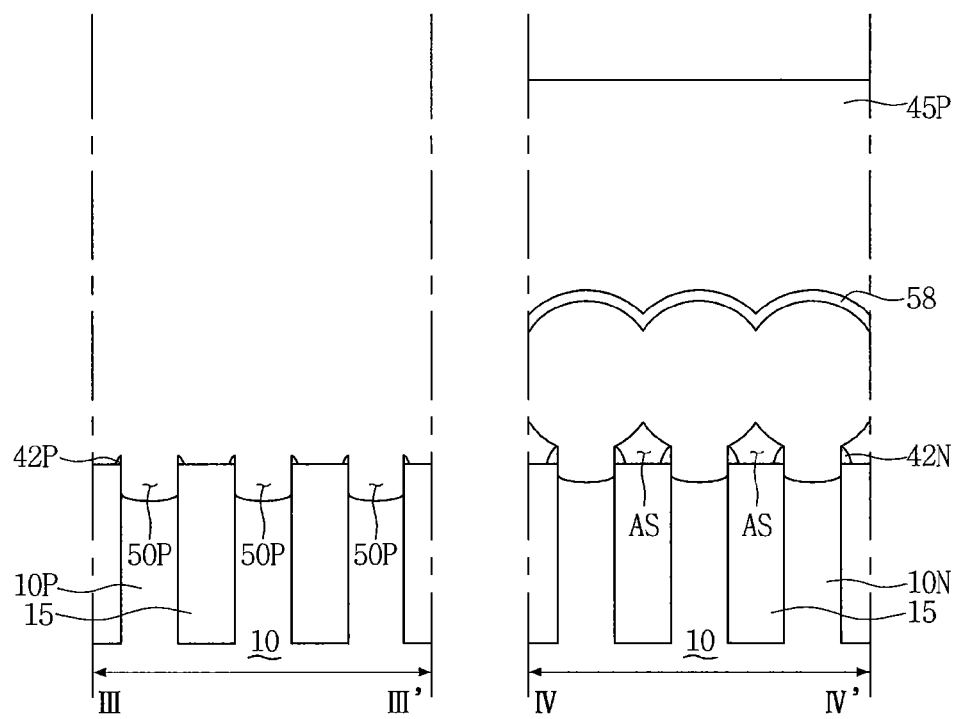

Referring to FIGS. 1, 18A, and 18B, the method may include, by performing the processes described with reference to FIGS. 8A and 8B to 10A and 10B, forming N-epitaxial regions 55N in the N-recess regions 50N, forming N-protection layers 58 on the N-epitaxial regions 55N, forming a P-open mask 45P covering the NMOS area NA and exposing the PMOS area PA, etching the spacer material layer 40 exposed in the PMOS area PA to form P-gate spacers 41P and P-fin active spacers 42P, and performing a P-fin recessing process to form P-recess regions 50P. The P-open mask 45P may be removed.

Figure 19A:
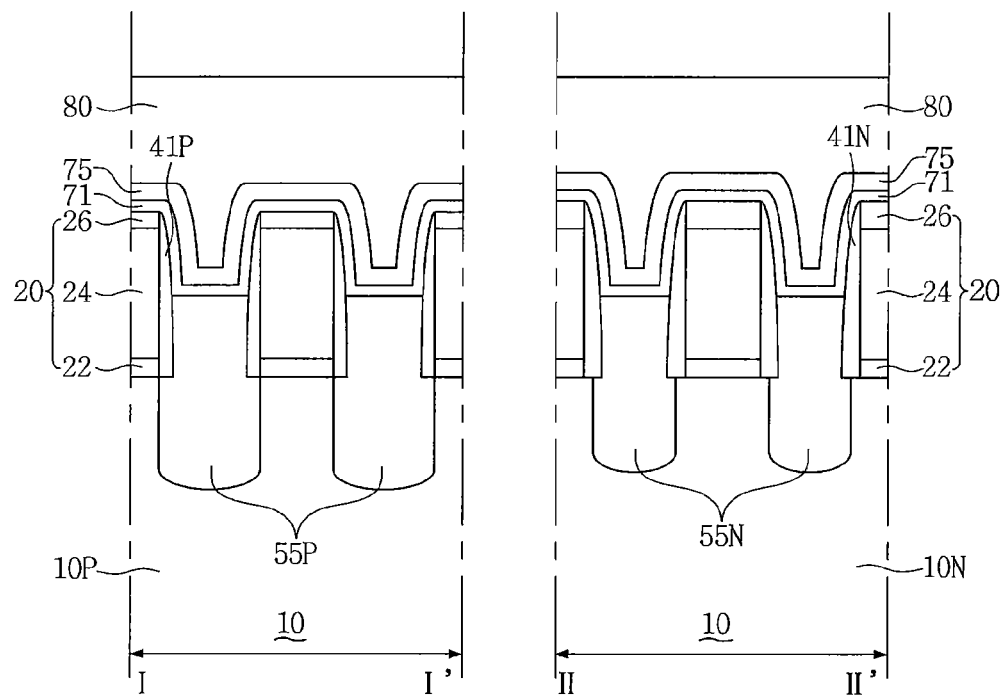
Figure 19B:
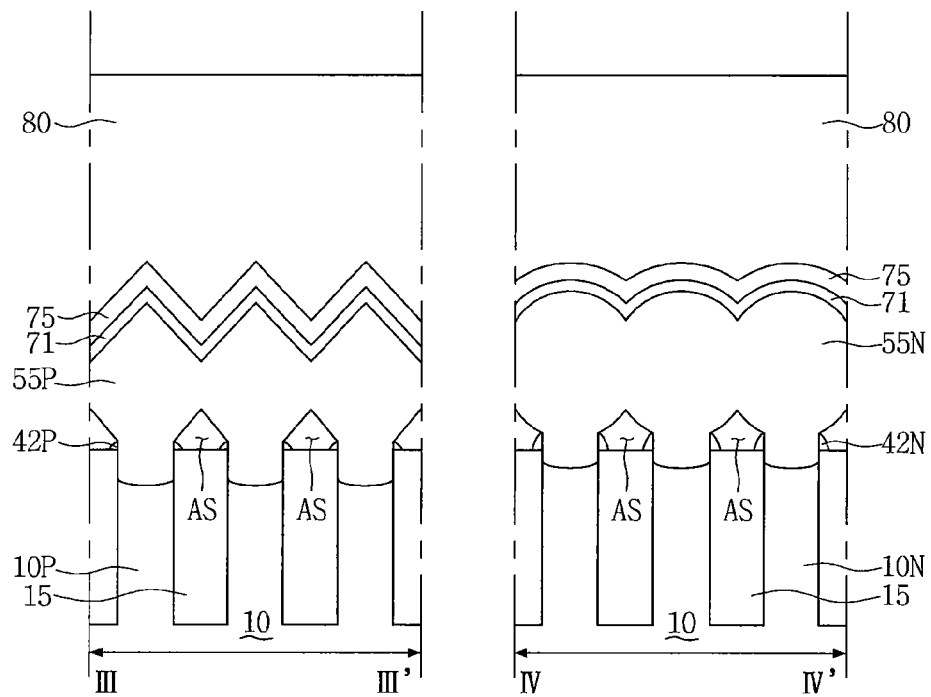

Referring to FIGS. 1, 19A, and 19B, the method may include performing the processes described with reference to FIGS. 11A and 11B to 12A and 12B to form P-epitaxial regions 55P in the P-recess regions 50P, removing the N-protection layer 58, and forming a capping oxide layer 71, a stopper layer 75, and an interlayer insulating layer 80, entirely.

Figure 20A:
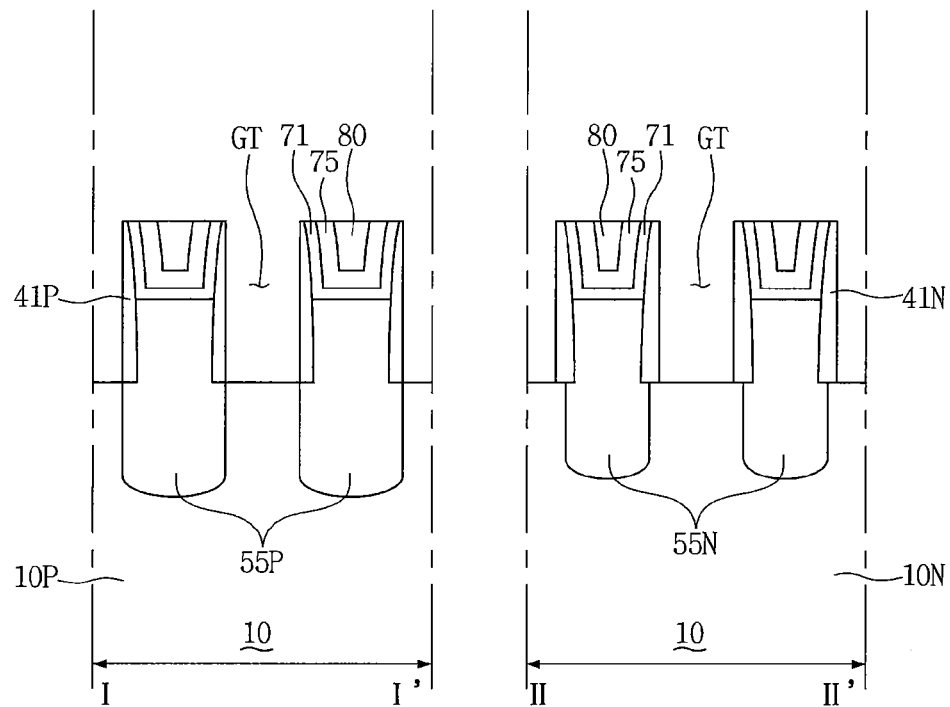
Figure 20B:
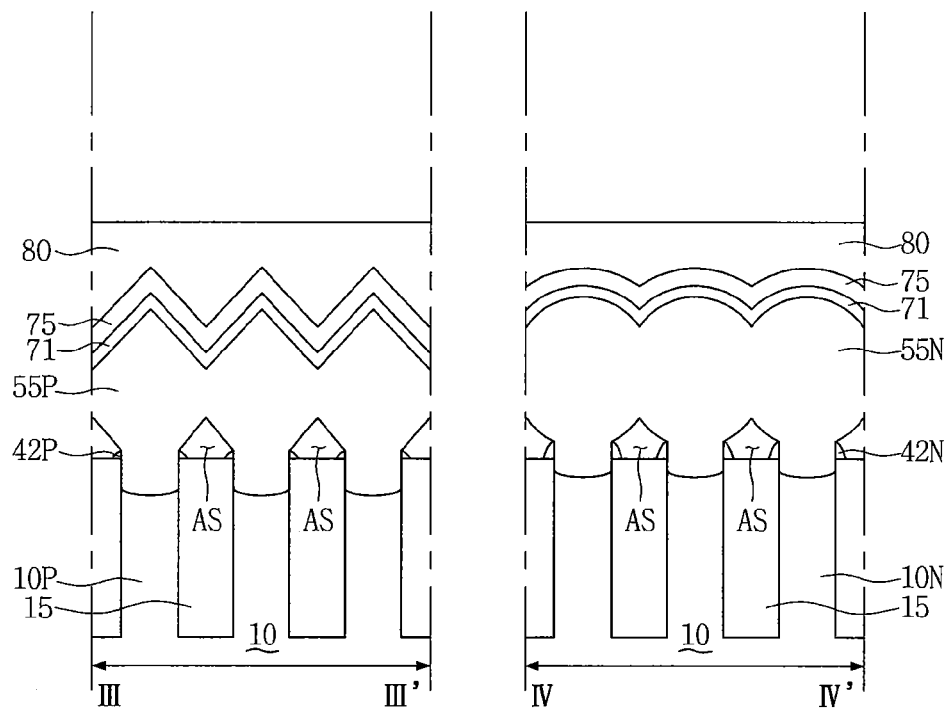

Referring to FIGS. 1, 20A, and 20B, the method may include, by performing the processes described with reference to FIGS. 13A and 13B to 14A and 14B, performing the first chemical mechanical polishing (CMP) process to planarize the interlayer insulating layer 80, the stopper layer 75, and the capping oxide layer 71 to expose the hard masks 26, and removing the hard masks 26, the sacrificial gate electrodes 24, and the sacrificial gate insulating layers 22 to form gate trenches GT.

The method may include performing the processes described with reference to FIGS. 15A and 15B to entirely form a gate insulating material layer 92, a gate barrier material layer 93, and a gate electrode material layer 94 to fill the gate trenches GT. The method may further include forming interface insulating layers 91 on the P-fin active regions 10P and the N-fin active regions 10N exposed in the gate trenches GT before forming the gate insulating material layer 92. In some embodiments, the interface insulating layer 91 may be omitted.

The method may include, by performing a second chemical mechanical polishing (CMP) process, removing the gate electrode material layer 94, the gate barrier material layer 93, and the gate insulating material layer 92 on the interlayer insulating layer 80 to form an N-gate patterns 90N having N-gate insulating layers 92N, N-gate barrier layers 93N, and N-gate electrodes 94N, and P-gate patterns 90P having P-gate insulating layers 92P, P-gate barrier layers 93N, and P-gate electrodes 94N so that the semiconductor device 100B shown in the FIG. 2B may be formed.

FIGS. 21A and 21B to 24A and 24B are cross-sections illustrating processing steps in the fabrication of semiconductor devices in accordance with some embodiments of the inventive concept. For example, FIGS. 21A to 24A are longitudinal cross-sections taken along the lines I-I' and II-IF in FIG. 1, and FIGS. 21B to 24B are longitudinal cross-sections taken along the lines III-III' and IV-IV' in FIG. 1.

Figure 21A:
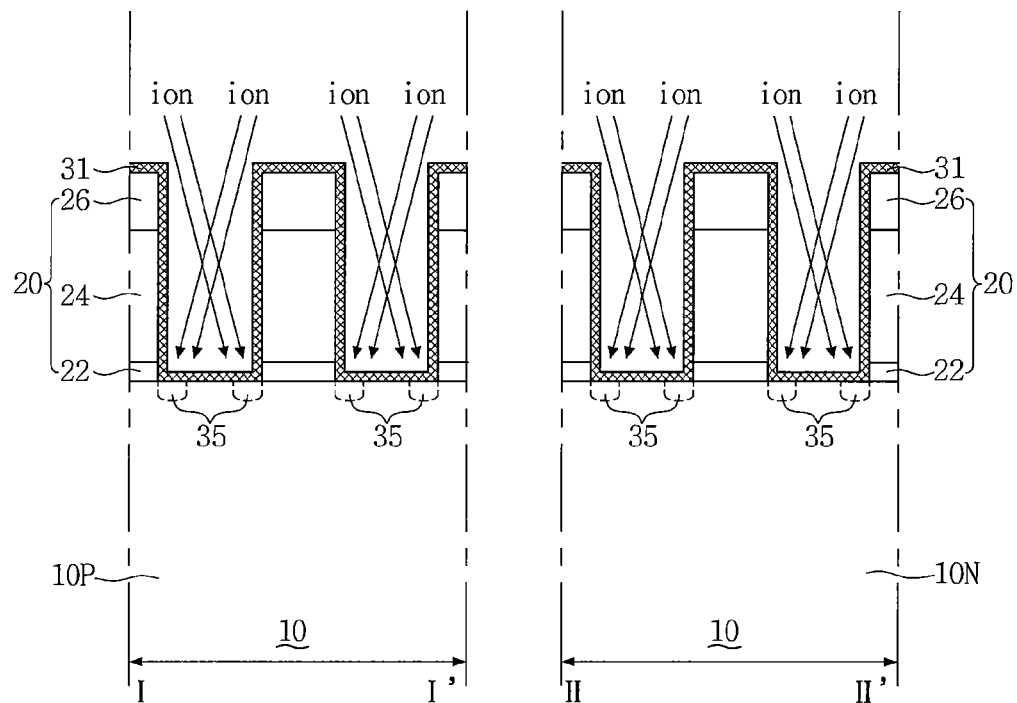
Figure 21B:
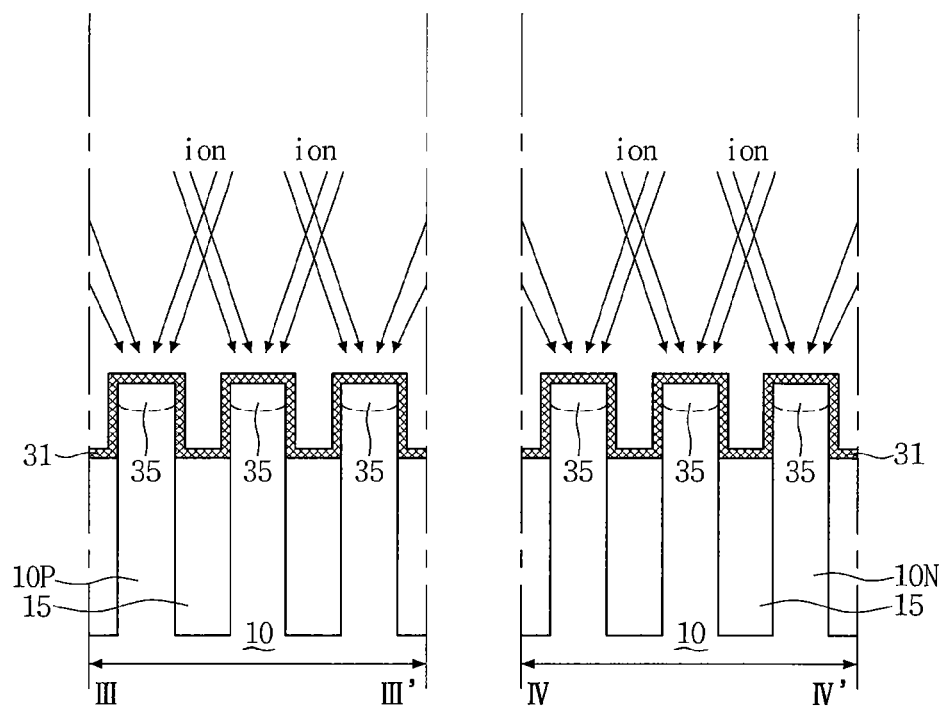

Referring to 1, FIGS. 21A, and 21B, a method of forming a semiconductor in accordance with some embodiments of the inventive concept may include performing the processes described with reference to FIGS. 3A and 3B, forming P-fin active regions 10P and N-fin active regions 10N on a substrate 10 defined by isolation regions 15, forming sacrificial gate patterns 20 on the P-fin active regions 10P and the N-fin active regions 10N, entirely forming an ion implantation buffer layer 31 on the P-fin active regions 10P and N-fin active regions 10N, and performing a diagonal ion implantation process to form ion implanted regions 35 in the P-fin active regions 10P and the N-fin active regions 10N. The diagonal ion implantation process may include diagonally implanting ions at about from 5 degrees to 15 degrees. The ion implanted regions 35 may be formed adjacent to the sacrificial gate patterns 20 in the P-fin active regions 10P and the N-fin active regions 10N.

Figure 22A:
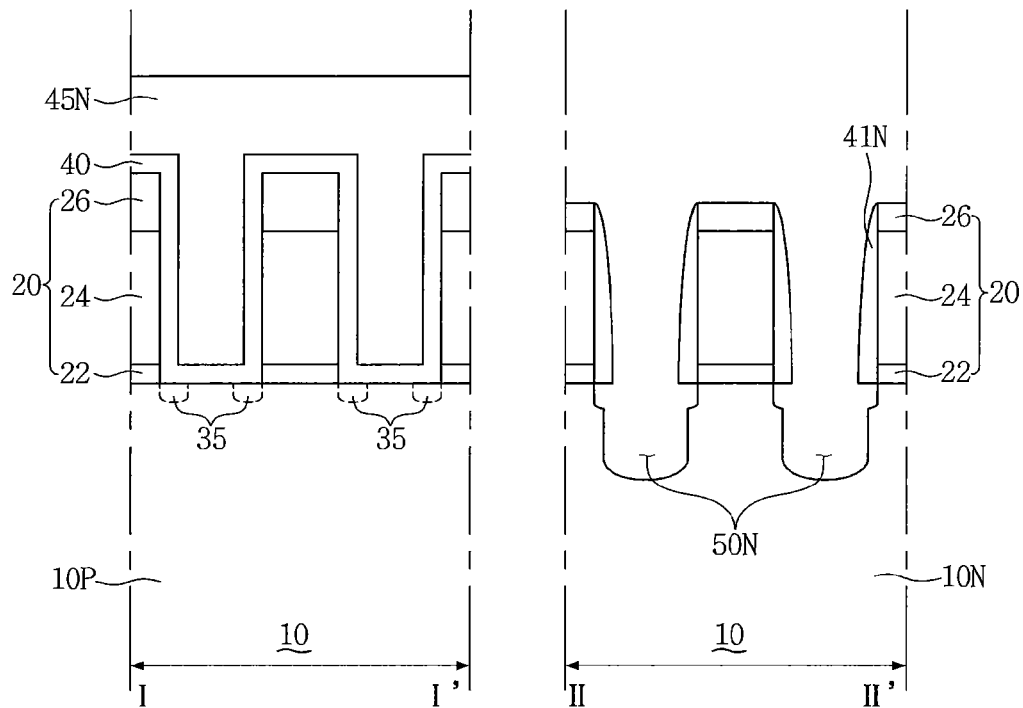
Figure 22B:
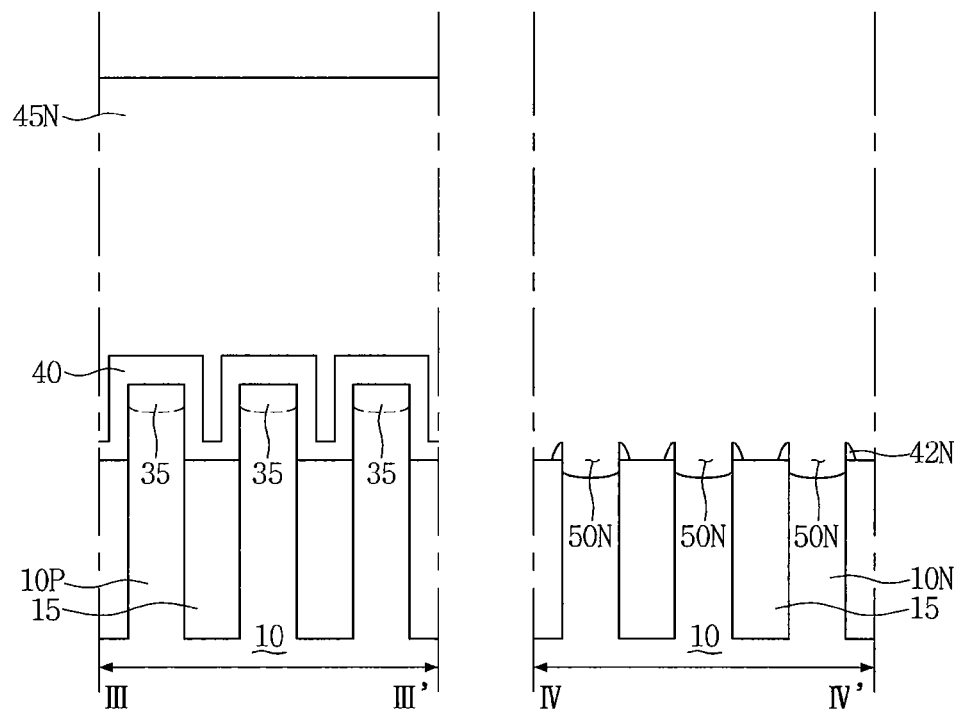

Referring to FIGS. 1, 22A, and 22B, the method may include, by performing the processes described with reference to FIGS. 5A and 5B to 7A to 7B, removing the ion implantation buffer layer 31, entirely forming a spacer material layer 40, forming an N-open mask 45N covering the PMOS area PA and exposing the NMOS area NA, etching the spacer material layer 40 exposed in the NMOS area NA to form N-gate spacers 41N and N-fin active spacers 42N, and performing an N-fin active recessing process to etch the N-fin active regions 10N between the N-gate spacers 41N and between the N-fin active spacers 42N to form N-recess regions 50N. Upper widths of the N-recess regions 50N may be greater than lower widths of the N-recess regions 50N.

Figure 23A:
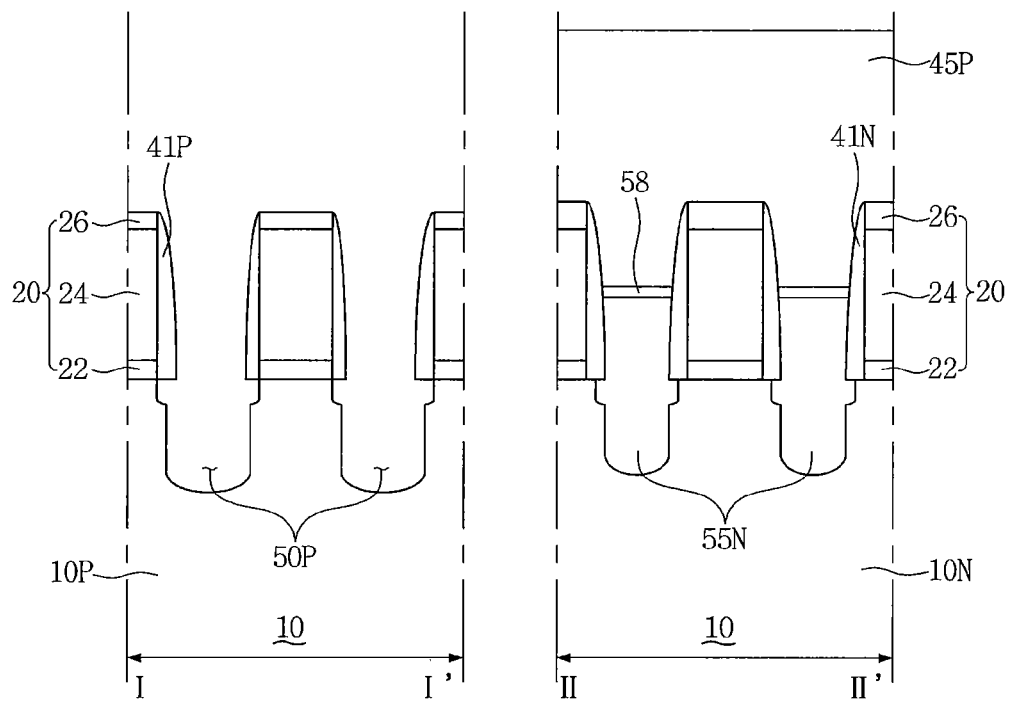
Figure 23B:
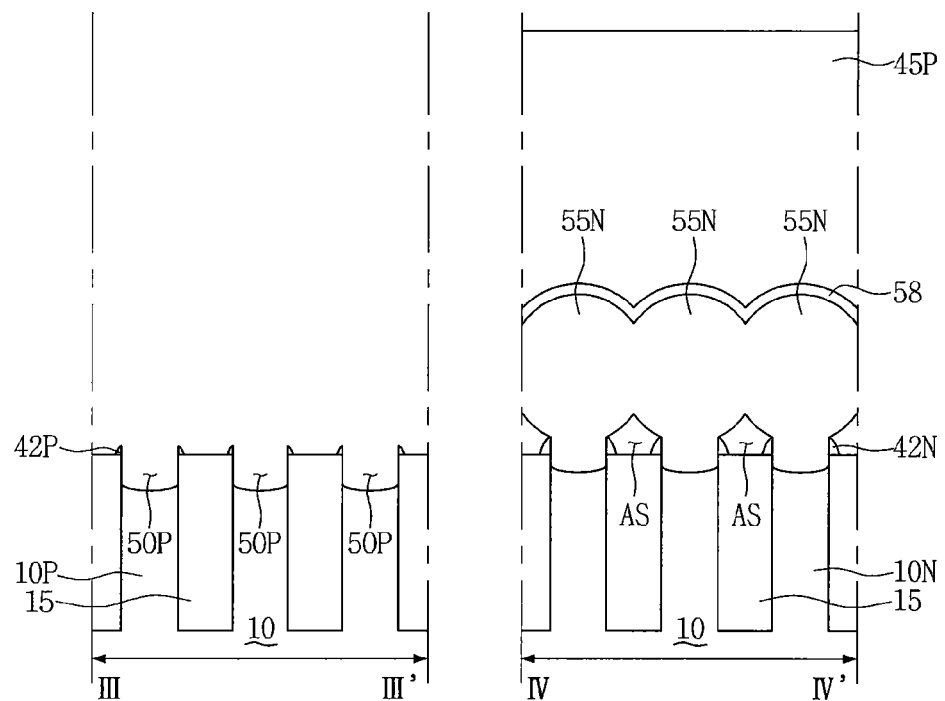

Referring to FIGS. 1, 23A, and 23B, the method may include, by performing the processes described with reference to FIGS. 8A and 8B to 10A and 10N, forming N-epitaxial regions 55N in the N-recess regions 50N, forming N-protection layers 58 on the N-epitaxial regions 55N, forming a P-open mask 45P covering the NMOS area NA and exposing the PMOS area PA, etching the spacer material layer 40 exposed in the PMOS area PA to form P-gate spacers 41P and P-fin active spacers 42P, and performing a P-fin active recessing process to form P-recess regions 50P. Upper widths of the P-recess regions 50P may be wider than lower widths of the P-recess regions 50P. The P-recess regions 50P may be formed deeper and wider than the N-recess regions 50N. The P-open mask 45P may be removed.

Figure 24A:
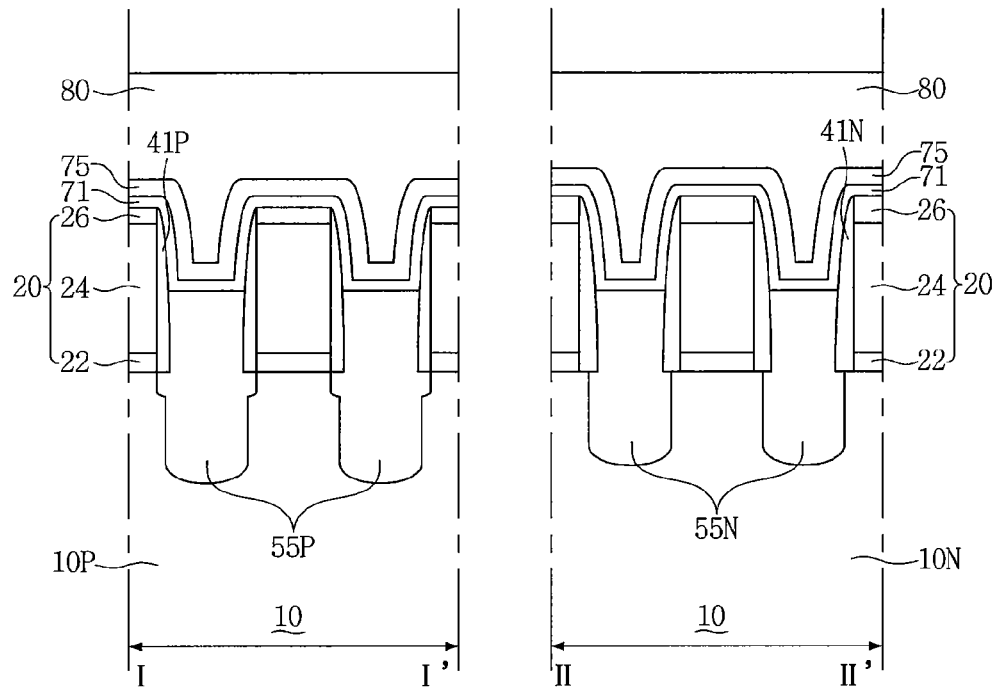
Figure 24B:
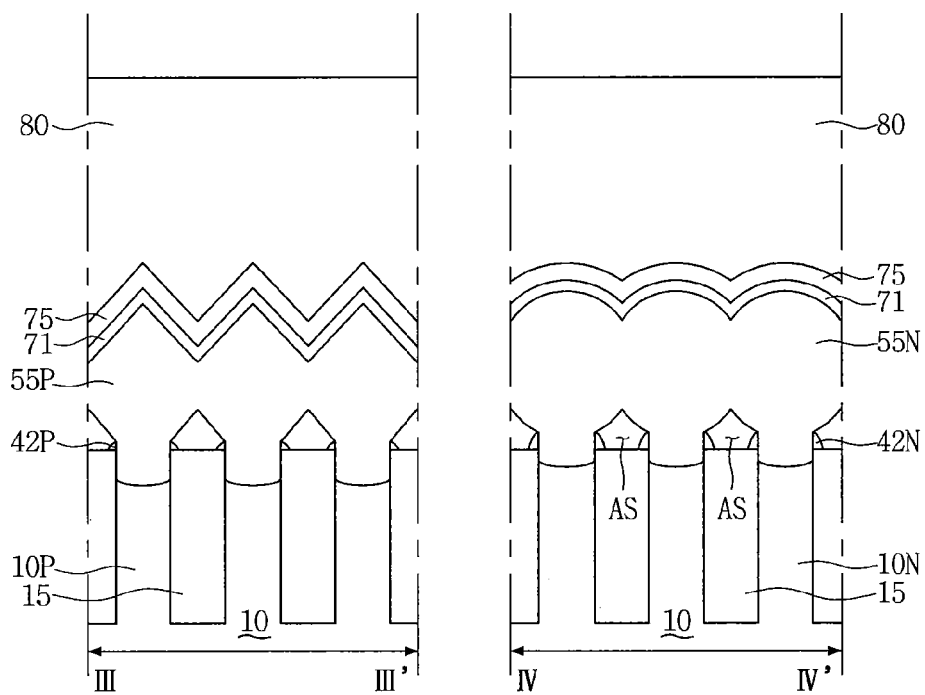

Referring to FIGS. 1, 24A, and 24B, the method may include, by performing the processes described with reference to FIGS. 11A and 11B to 15A and 15B, forming P-epitaxial regions 55P in the P-recess regions 50P, removing the N-protection layers 58, entirely forming a capping oxide layer 71, a stopper layer 75, and an interlayer insulating layer 80, performing a first chemical mechanical polishing (CMP) process to planarize the interlayer insulating layer 80, the stopper layer 75, and the capping oxide layer 71 to expose the hard masks 26, removing the hard masks 26, the sacrificial gate electrodes 24, the sacrificial gate insulating layers 22 to form gate trenches GT, and entirely forming a gate insulating material layer 92, a gate barrier material layer 93, and a gate electrode material layer 94 to fill the gate trenches GT. The method may further include forming interlayer insulating layers 91 on surfaces of the P-fin active regions 10P and the N-fin active regions 10N exposed in the gate trenches GT before forming the gate insulating material layer 92. In some embodiments, the interface insulating layer 91 may be omitted.

The method may include performing a second chemical mechanical polishing (CMP) process to partially remove the gate electrode material layer 94, the gate barrier material layer 93, and the gate insulating material layer 92 to form N-gate patterns 90N having N-gate insulating layers 92N, N-gate barrier layers 93N, and N-gate electrodes 94N, and P-gate patterns 90P having P-gate insulating layers 92P, P-gate barrier layers 93P, and P-gate electrodes 94P so that the semiconductor devices 100C shown in the FIG. 2C may be formed.

Figure 27A:
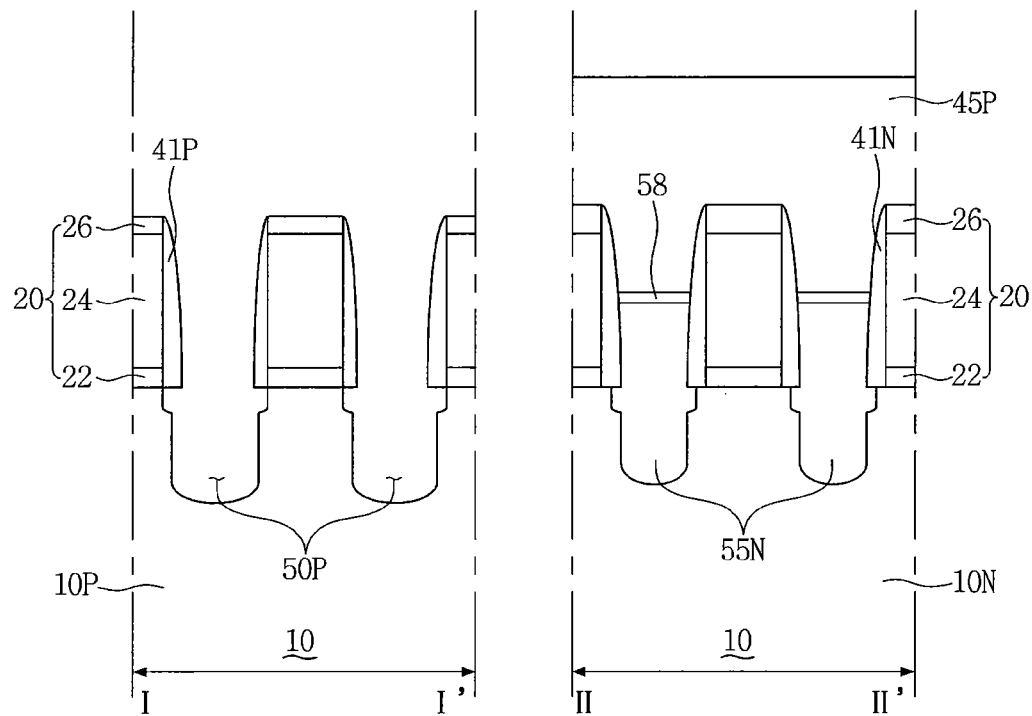
Figure 27B:
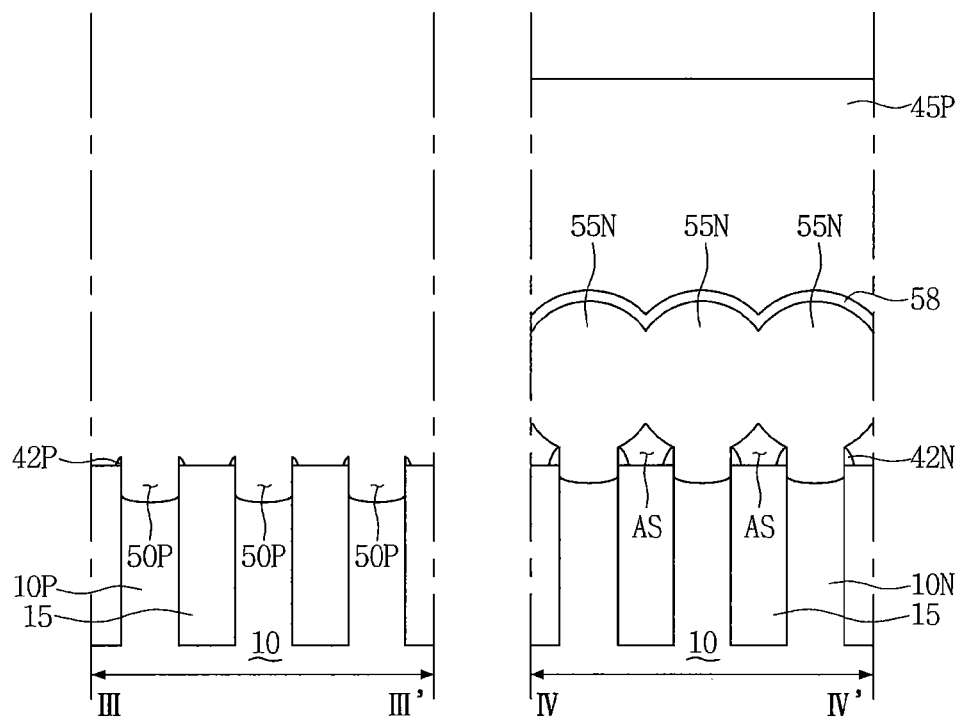
Figure 28A:
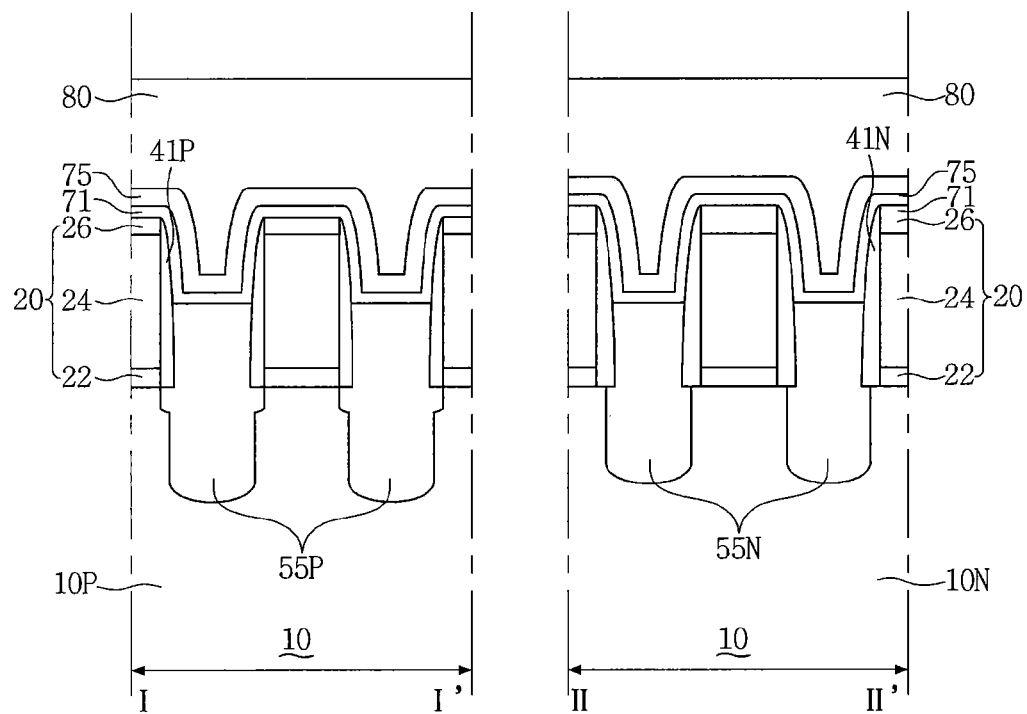
Figure 28B:
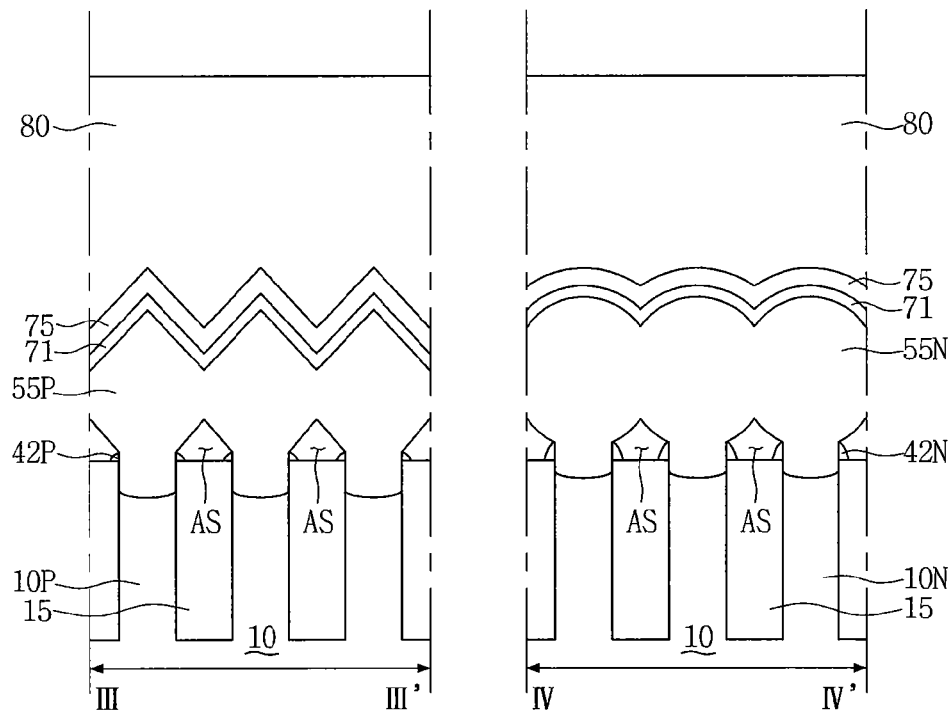

FIGS. 25A and 25B to 28A and 28B are cross-sections illustrating processing steps in the fabrication of semiconductor devices in accordance with some embodiments of the inventive concept. For example, FIGS. 25A to 28A are longitudinal cross-sections taken along the lines I-I' and II-II' in FIG. 1, and FIGS. 28B to 28B are longitudinal cross-sections taken along the lines and IV-IV' in FIG. 1.

Figure 25A:
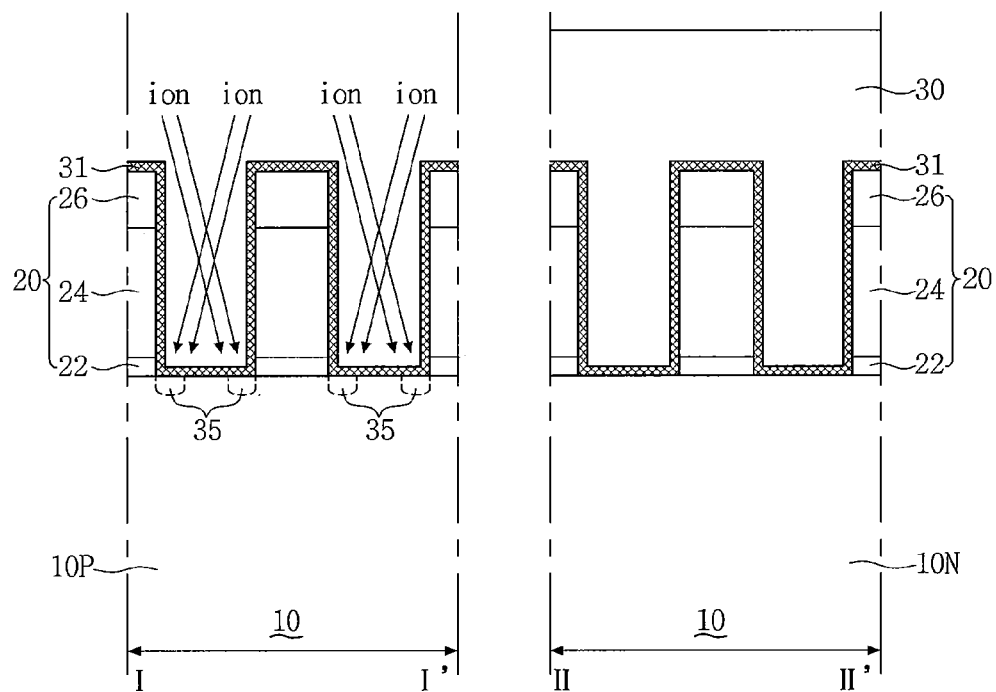
Figure 25B:
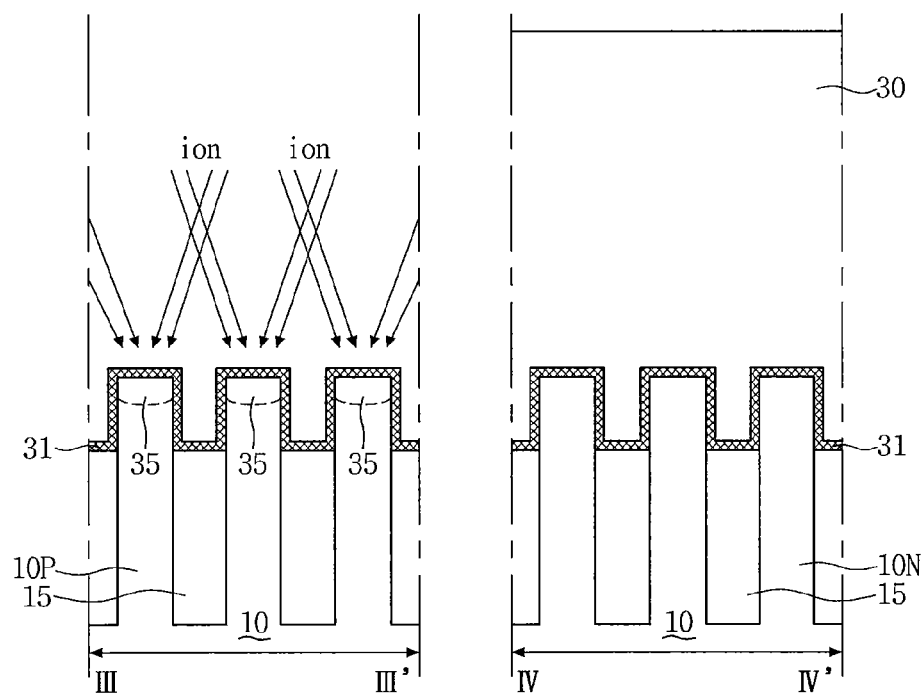

Referring to FIGS. 1, 25A, and 25B, a method of forming a semiconductor device in accordance with some embodiments of the inventive concept may include, by selectively performing the processes described with reference to FIGS.

3A, 3B, 4A, 4B, 16A, 16B, 21A, and 21B, forming P-fin active regions 10P and N-fin active regions 10N defined by isolation regions 15 on a substrate 10, forming sacrificial gate patterns 20 on the P-fin active regions 10P and the N-fin active regions 10N, forming an ion implantation buffer layer 31 on the P-fin active region 10P and the N-fin active region 10, forming a mask pattern 30 covering the NMOS area NA and exposing the PMOS area PA, and performing a diagonal ion implantation process to form ion implanted regions 35 in the P-fin active regions 10P.

Figure 26A:
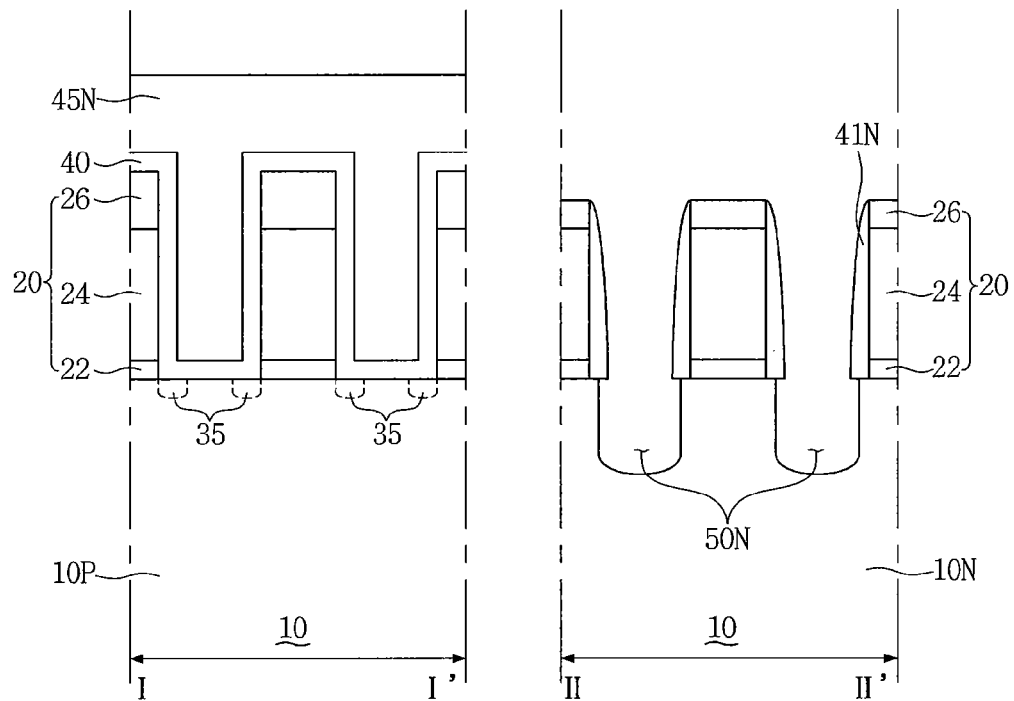
Figure 26B:
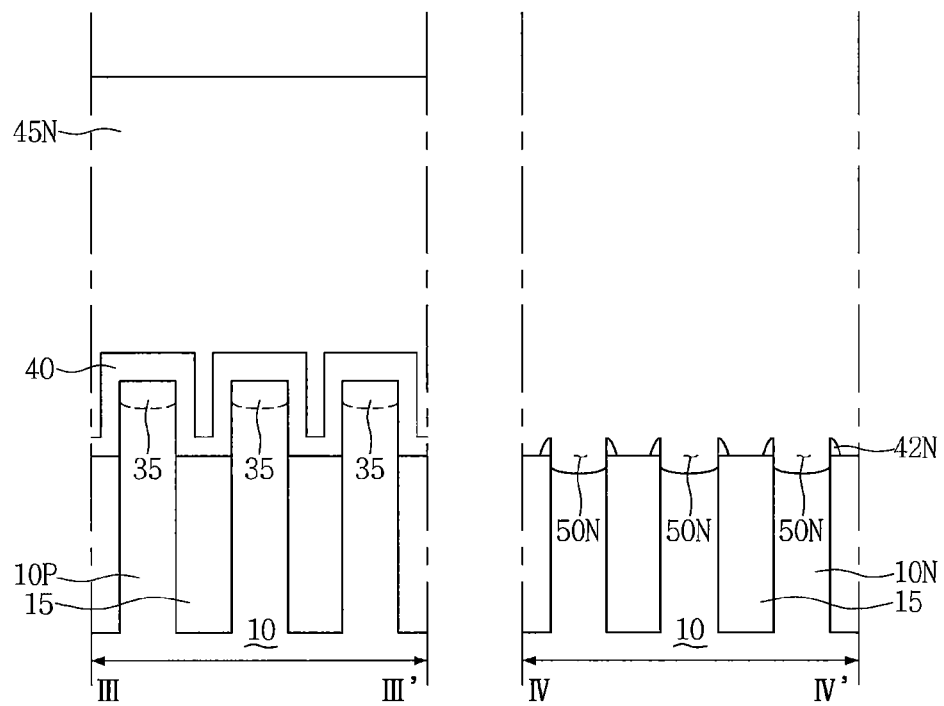

Referring to FIGS. 1, 26A, and 26B, the method may include, by performing the processes described with reference to FIGS. 5A and 5B to 7A and 7B, removing the ion implantation buffer layer 31, entirely forming a spacer material layer 40, forming an N-open mask 45N covering the PMOS area PA and exposing the NMOS area NA, etching the spacer material layer 40 exposed in the NMOS area NA to form N-gate spacers 41N and N-fin active spacers 42N, and performing an N-fin active recessing process to etching the N-fin active regions 10N between the N-gate spacers 41N and between the N-fin active spacers 42N to form N-recess regions 50N. The N-open mask 45N may be removed. Sidewalls of the N-recess region 50N may be vertically flat.

Referring to FIGS. 1, 27A, and 27B, the method may include, by performing the processes described with reference to FIGS. 8A and 8B to 10A and 10B, forming N-epitaxial regions 55N in the N-recess regions 50N, forming N-protection layers 58 on the N-epitaxial regions 55N, forming a P-open mask 45P covering the NMOS area NA and exposing the PMOS area PA, etching the spacer material layer 40 exposed in the PMOS area PA to form P-gate spacers 41P and P-fin active spacers 42P, and performing a P-fin active recessing process to form P-recess regions 50P. Upper widths of the P-recess regions 50P may be wider than lower widths of the P-recess region 50P. The P-recess regions 50P may be deeper and/or wider than the N-recess regions 50N. The P-open mask 45 may be removed.

Referring to FIGS. 1, 28A, and 28B, the method may include, by performing the processes described with reference to FIGS. 11A and 11B to 15A and 15B, forming P-epitaxial regions 55P in the P-recess regions 50P, removing the N-protection layers 58, entirely forming a capping oxide layer 71, a stopper layer 75, and interlayer insulating layer 80, performing a first chemical mechanical polishing (CMP) process to planarize the interlayer insulating layer 80, the stopper layer 75, and the capping oxide layer 71 to expose the hard masks 26, removing the hard masks 26, the sacrificial gate electrodes 24, and the sacrificial gate insulating layers 22 to form gate trenches GT, entirely forming a gate insulating material layer 92, a gate barrier material layer 93, and a gate electrode material layer 94 to fill the gate trenches GT. The method may further include forming interface insulating layers 91 on surfaces of the P-fin active region 10P and the N-fin active region 10N exposed in the gate trenches GT, before forming the gate insulating material layer 92. The interface insulating layer 91 may be omitted.

The method may include, by performing a second chemical mechanical polishing (CMP) process, removing the gate electrode material layer 94, the gate barrier material layer 93, and the gate insulating material layer 92 formed on the interlayer insulating layer 80 to form N-gate patterns 90N having N-gate insulating layers 92N, N-gate barrier layers 93N, and N-gate electrodes 94N, and P-gate patterns 90P having P-gate insulating layers 92P, P-gate barrier layers 93P, and P-gate electrodes 94P so that the semiconductor device 100D shown in FIG. 2D may be formed.

Figure 29A:
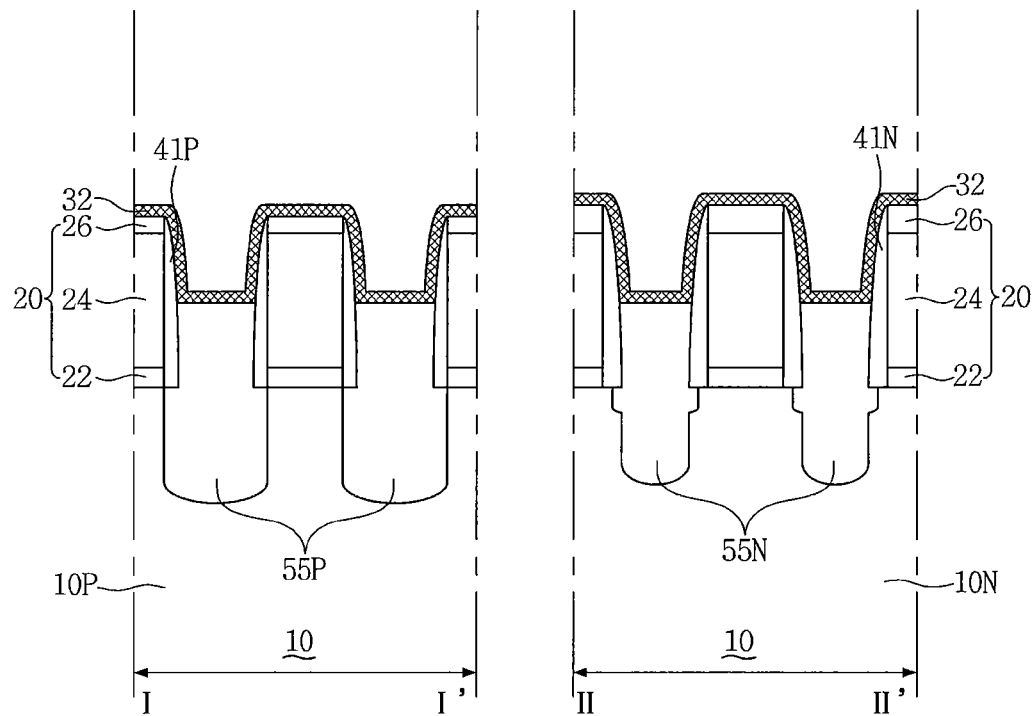
Figure 29B:
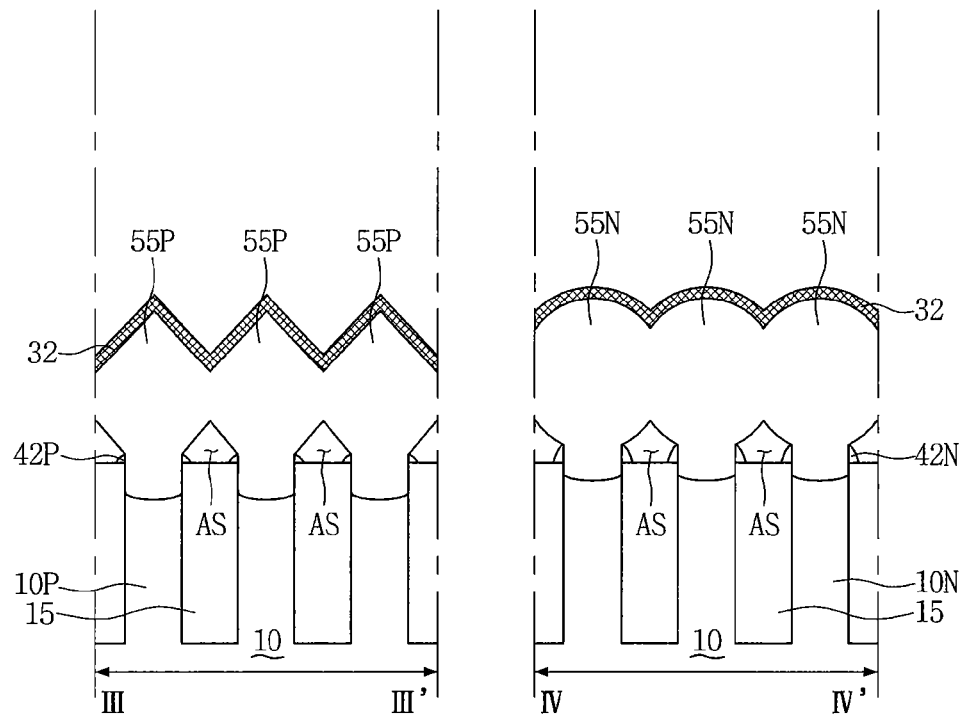

FIGS. 29A and 29B to FIGS. 31A and 31B are longitudinal cross-sections processing steps in the fabrication of semiconductor devices in accordance with some embodiments of the inventive concept. Referring first to FIGS. 1, 29A, and 29B, a method of forming a semiconductor device in accordance with some embodiments of the inventive concept may include performing the processes described with reference to FIGS. 3A and 3B to 11A and 11B to form P-epitaxial regions 55P and N-epitaxial regions 55N, and to form a source/drain ion implantation buffer layer 31, entirely. The source/drain ion implantation buffer layer 31 may include silicon oxide ($SiO_2$).

Figure 30A:
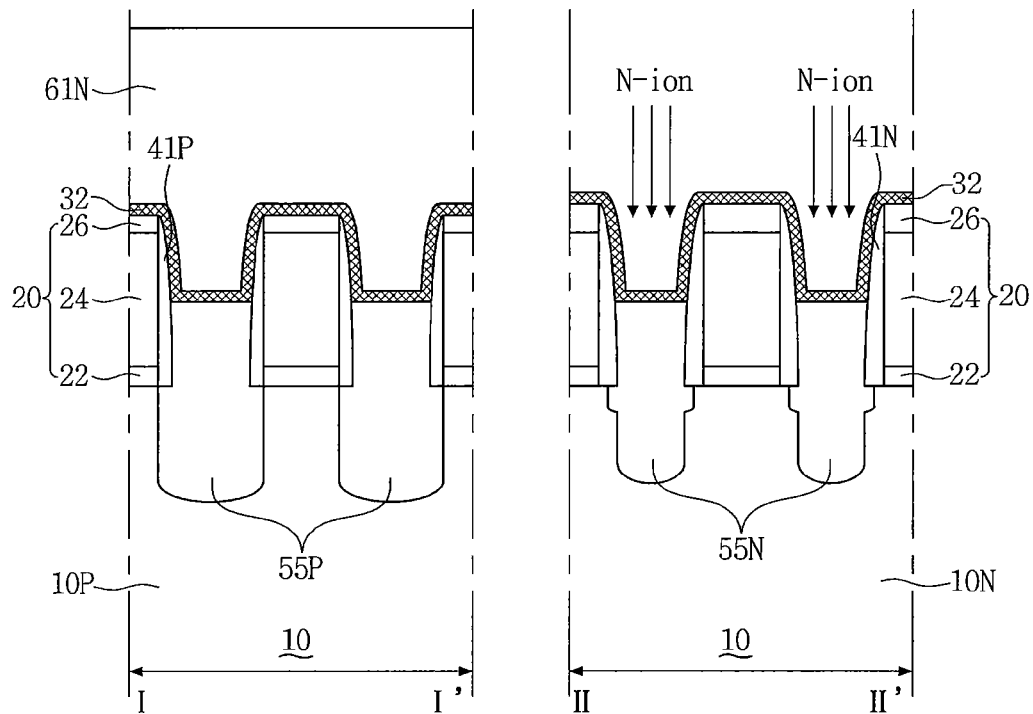
Figure 30B:
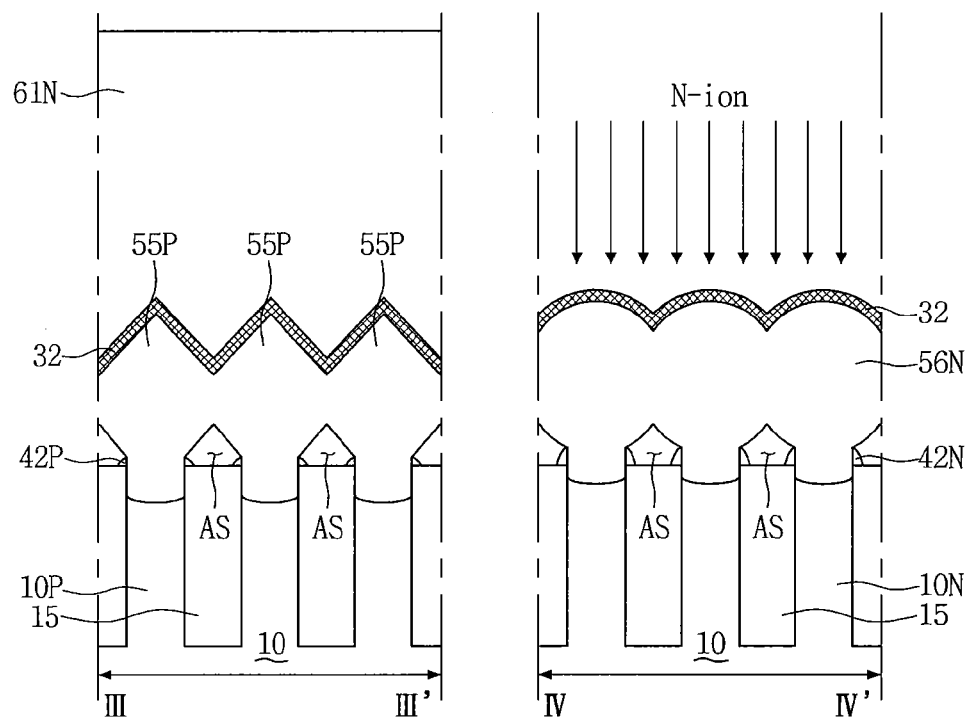

Referring to 1, FIGS. 30A, and 30B, the method may include forming an N-open ion implantation mask 61N covering the PMOS area PA and exposing the NMOS area NA, and performing an N-ion implantation process to form N-source/drain regions 56N by injecting N-type ions into the N-epitaxial regions 55N in the NMOS area NA. The N-ion implantation process may be performed with an acceleration voltage higher than an acceleration voltage of the first ion implantation process. Accordingly, the N-type ions may be distributed as a whole in the N-epitaxial regions 55N or the N-source/drain regions 56N. The N-open ion implantation mask 61N may include a photoresist. The N-type ions may include phosphorous (P) and/or arsenic (As). The N-open ion implantation mask 61N may be removed.

Figure 31A:
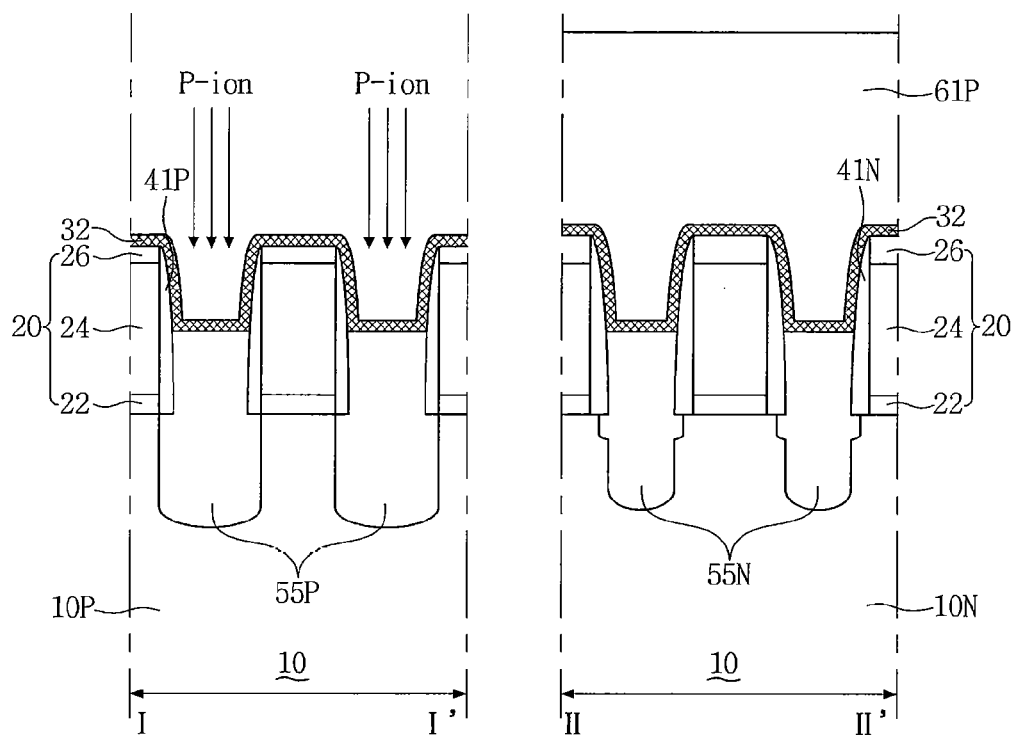
Figure 31B:
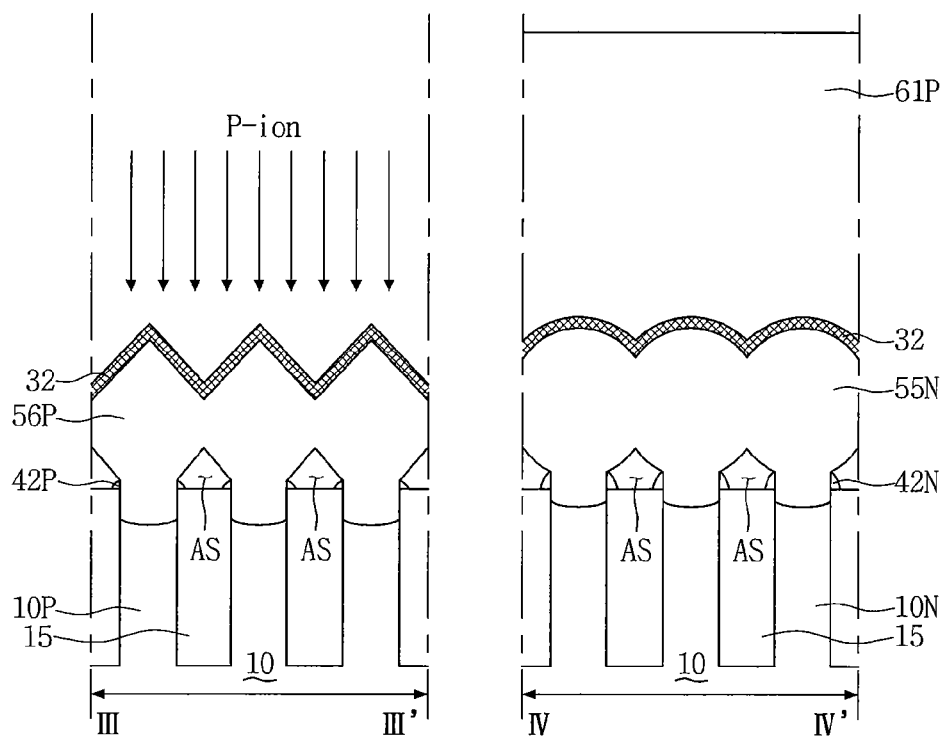

Referring to FIGS. 1, 31A, and 31B, the method may include forming a P-open ion implantation mask 61P covering the NMOS area NA and exposing the PMOS area PA, and performing a P-ion implantation process to form P-source/drain regions 56P by injecting P-type ions into the P-epitaxial regions 55P in the PMOS area PA. The P-ion implantation process may be performed with an acceleration voltage higher than the acceleration voltages of the first ion implantation process and the N-ion implantation process. Accordingly, the P-type ions may be distributed as a whole in the P-epitaxial regions 55P or the P-source/drain regions 56P. The P-open ion implantation mask 61P may include a photoresist. The P-type ions may include boron (B). The P-open ion implantation mask 61P may be removed.

The method may include performing the processes described with reference to FIGS. 12A and 12B, 19A and 19B, 24A and 24B, and/or 28A and 28B.

Figure 32A:
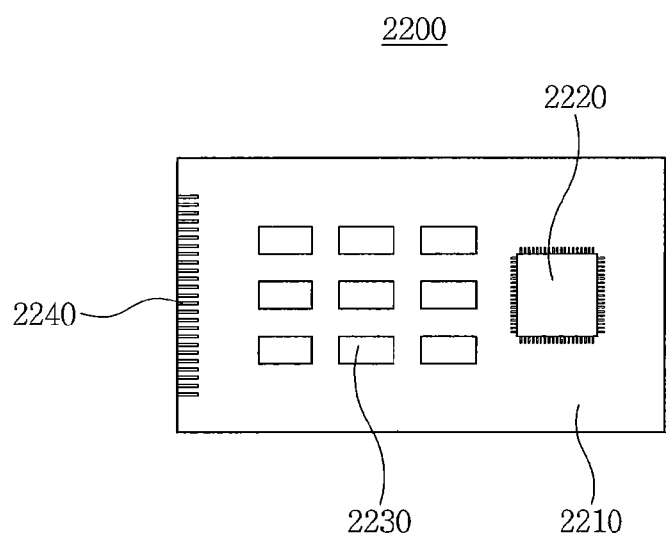
FIG. 32A is a diagram illustrating a semiconductor module in accordance with some embodiments of the inventive concept.

FIG. 32A is a diagram conceptually showing a semiconductor module 2200 in accordance with some embodiments of the inventive concept. Referring to FIG. 32A, the semiconductor module 2200 in accordance with embodiments of the inventive concept may include a processor 2220 mounted on a module substrate 2210, and semiconductor devices 2230. The processor 2220 or the semiconductor devices 2230 may include at least one of the semiconductor devices 100A-100D in accordance with various embodiments of the inventive concept. Conductive input/output terminals 2240 may be disposed on at least one side of the module substrate 2210.

Figure 32B:
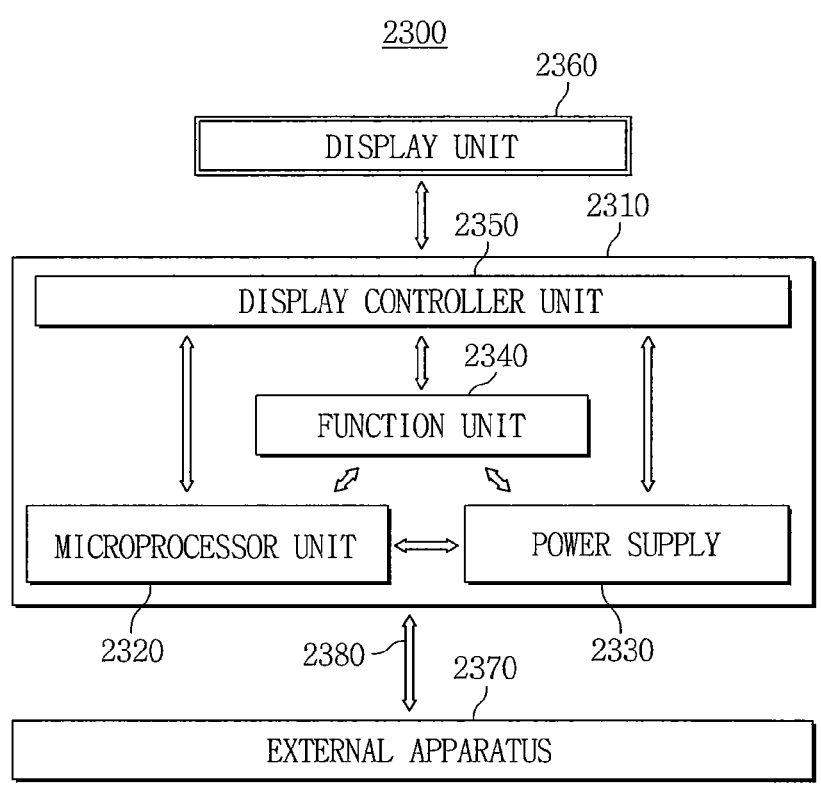
FIGS. 32B and 32C are block diagrams illustrating electronic systems in accordance with some embodiments of the inventive concept.

FIG. 32B is a block diagram conceptually showing an electronic system 2300 in accordance with embodiments of the inventive concept. Referring to FIG. 32B, the electronic system 2300 in accordance with some embodiments of the inventive concept may include a body 2310, a display unit 2360, and an external apparatus 2370. The body 2310 may include a microprocessor unit 2320, a power supply 2330, a function unit 2340, and/or a display controller unit 2350. The body 2310 may include a system board or motherboard including a PCB and/or a case. The microprocessor unit 2320, the power supply 2330, the function unit 2340, and the display controller unit 2350 may be mounted or disposed on an upper surface or an inside of the body 2310. The display unit 2360 may be disposed on the upper surface of the body 2310 or inside/outside of the body 2310. The display unit 2360 may display an image processed by the display controller unit 2350. For example, the display unit 2360 may include a liquid crystal display (LCD), an active matrix organic light emitting diode (AMOLED), or various display panels. The display unit 2360 may include a touch screen. Accordingly, the display unit 2360 may include an input/output function. The power supply 2330 may supply a current or voltage to the microprocessor unit 2320, the function unit 2340, the display controller unit 2350, etc. The power supply 2330 may include a rechargeable battery, a socket for the battery, or a voltage/current converter. The microprocessor unit 2320 may receive a voltage from the power supply 2330 to control the function unit 2340 and the display unit 2360. For example, the microprocessor unit 2320 may include a CPU or an application processor (AP). The function unit 2340 may include a touch-pad, a touch-screen, a volatile/nonvolatile memory, a memory card controller, a camera, a lighting, an audio and video playback processor, a wireless transmission/reception antenna, a speaker, a microphone, a USB port, and other units having various functions. The microprocessor unit 2320 or the function unit 2340 may include at least one of the semiconductor devices 100A-100D in accordance with various embodiments of the inventive concept.

Figure 32C:
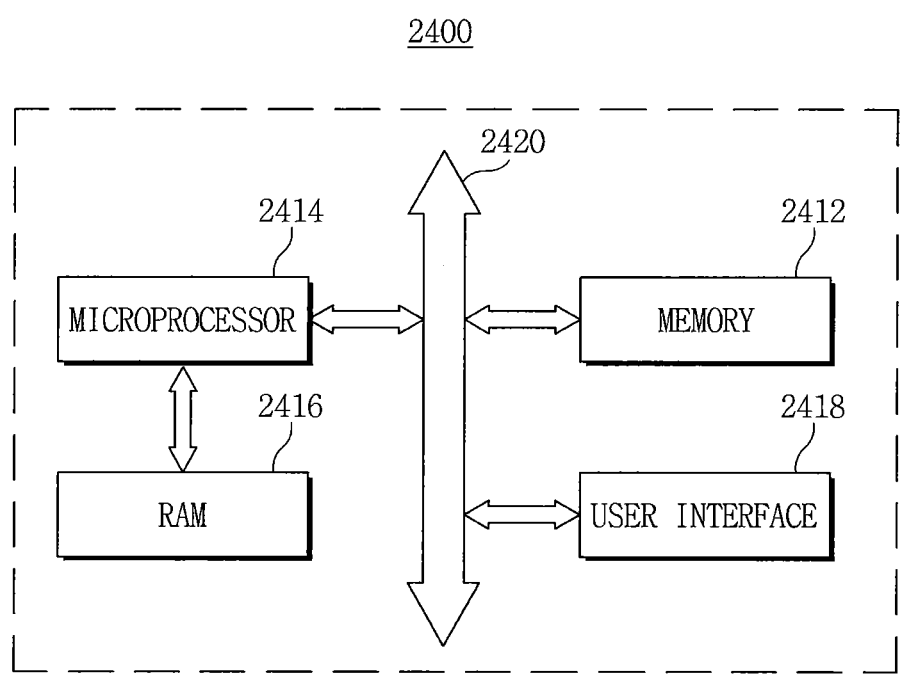

FIG. 32C illustrates a block diagram conceptually showing an electronic system 2400 in accordance with some embodiments of the inventive concept. Referring to FIG. 32C, the electronic system 2400 in accordance with embodiments of the inventive concept may include a microprocessor 2414, a memory 2412, and a user interface 2418 which performs data communication using a bus 2420. The microprocessor 2414 may include a CPU or an AP. The electronic system 2400 may further include a random access memory (RAM) 2416 which directly communicates with the microprocessor 2414. The microprocessor 2414 and/or the RAM 2416 may be assembled in a single package. The user interface 2418 may be used to input data to or output data from the electronic system 2400. For example, the user interface 2418 may include a touch-pad, a touch-screen, a keyboard, a mouse, a scanner, a voice detector, a cathode ray tube (CRT) monitor, an LCD, an AMOLED, a plasma display panel (PDP), a printer, a lighting, or various other input/output devices. The memory 2412 may store codes for operating the microprocessor 2414, data processed by the microprocessor 2414, or external input data. The memory 2412 may include a memory controller, a hard disk, or a solid state drive (SSD). The microprocessor 2414, the RAM 2416, and/or the memory 2412 may include at least one of the semiconductor devices 100A-100D in accordance with various embodiments of the inventive concept.

The semiconductor devices in accordance with embodiments of the inventive concept can have P-source/drain regions and/or N-source/drain regions having vertically flattened sidewalls so that performance of PMOS transistors and/or NMOS transistors can be improved.

Semiconductor devices in accordance with some embodiments of the inventive concept may have N-source/drain regions and/or P-source/drain regions having an upper width greater than a lower width so that performance of NMOS transistors and/or PMOS transistors can be improved.

Although a few embodiments have been described, those skilled in the art will readily appreciate that many modifications are possible without materially departing from the novel teachings and advantages. Accordingly, all such modifications are intended to be included within the scope of this inventive concept as defined in the claims.

What is claimed is:

1. A semiconductor device, comprising:
    a first isolation region defining a first fin active region protruding from a substrate;
    first gate patterns on the first fin active region; and
    a first epitaxial region in the first fin active region between the first gate patterns,
    wherein sidewalls of the first epitaxial region comprise first inflection points so that an upper width of the first epitaxial region is greater than a lower width of the first epitaxial region;
    wherein lower portions of the sidewalls of the first epitaxial region below the first inflection points are vertically flat; and
    wherein the first fin active region comprises a plurality of fin active regions connected in a bridge shape.

2. The semiconductor device of claim 1, wherein a width of the first epitaxial region adjacent to a surface of the first fin active region is a maximum width therein.

3. The semiconductor device of claim 1, further comprising an air space between the first fin active region and the first isolation region.

4. The semiconductor device of claim 1, further comprising:
    a second fin active region protruding from the substrate;
    second gate patterns on the second fin active region; and
    a second epitaxial region in the second fin active region between the second gate patterns,
    wherein the second epitaxial region is wider and deeper than the first epitaxial region.

5. The semiconductor device of claim 4, wherein sidewalls of the second epitaxial region comprise second inflection points so that an upper width of the second epitaxial region is greater than a lower width of the second epitaxial region.

6. The semiconductor device of claim 4:
    wherein the first epitaxial region comprises at least one of silicon (Si) and silicon carbide (SiC); and
    the second epitaxial region comprises silicon-germanium (SiGe).

7. The semiconductor device of claim 1, wherein each of the first gate patterns comprises:
    first interface insulating layers on a surface of the first fin active region;
    first gate electrodes on the first interface insulating layers;
    first gate barrier layers surrounding outer sidewalls and bottom surfaces of the first gate electrodes in a U-shape;
    first gate insulating layers surrounding outer sidewalls and bottom surfaces of the first gate barrier layers in a U-shape; and
    first spacers on outer sidewalls of the first gate insulating layers.

8. A semiconductor device, comprising:
    an isolation region defining a first fin active region and a second fin active region that protrudes from a substrate;
    first gate patterns on the first fin active region and second gate patterns on the second fin active region; and
    a first source/drain region in the first fin active region between the first gate patterns and a second source/drain region in the second fin active region between the second gate patterns,
    wherein the second source/drain region comprises sidewalls having inflection points so that an upper width of the second source/drain region is greater than a lower width of the second source/drain region; and wherein the device further comprises:

first gate spacers on sidewalls of the first gate patterns; and second gate spacers on sidewalls of the second gate patterns, wherein the first gate spacers are thinner than the second gate spacers.

9. The semiconductor device of claim 8, wherein the first source/drain region comprises sidewalls that are vertically flat and substantially vertically aligned with interfaces between the first gate patterns and the first gate spacers.

10. The semiconductor device of claim 8, wherein the sidewalls of the second source/drain region vertically overlap and align with the second gate spacers.

11. The semiconductor device of claim 8, wherein the first source/drain region has sidewalls having inflection points so that an upper width of the first source/drain region is greater than a lower width thereof.

12. A semiconductor device, comprising:

gate patterns extending in parallel with each other in a first direction; and source/drain regions between the gate patterns, the source/drain regions having upper and lower portions and the lower portion having sidewalls that are vertically flat, wherein the upper and lower portions of the source/drain regions are separated by inflection points so that a width of the upper portion is greater than a width of the lower portion; and wherein the device further comprises fin active regions extending in parallel with each other in a second direction, perpendicular to the first direction so as to intersect the gate patterns, wherein the gate patterns comprise butting gate patterns overlapping both ends of the fin active regions.

13. The semiconductor device of claim 12, further comprising:

gate spacers on sidewalls of the gate patterns, wherein the sidewalls of the lower portion of the source/drain regions are substantially vertically aligned with interfaces between the gate patterns and the gate spacers.

14. The semiconductor device of claim 13, further comprising an isolation region defining the fin active regions protruding from a substrate.

15. The semiconductor device of claim 14, wherein the fin active region comprises a plurality of fin active regions connected in a bridge shape.

16. The semiconductor device of claim 15, further comprising an air space between the fin active region and the isolation region.

* * * * *